(12) United States Patent
Lee et al.

(10) Patent No.: US 7,592,665 B2
(45) Date of Patent: Sep. 22, 2009

(54) NON-VOLATILE MEMORY DEVICES HAVING FLOATING GATES

(75) Inventors: Joon-Hee Lee, Seongnam-si (KR); Jong-Ho Park, Seoul (KR); Jin-Hyun Shin, Suwon-si (KR); Sung-Hoi Hur, Seoul (KR); Yong-Seok Kim, Seoul (KR); Jong-Won Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 218 days.

(21) Appl. No.: 11/594,327

(22) Filed: Nov. 8, 2006

(65) Prior Publication Data

US 2007/0108498 A1 May 17, 2007

(30) Foreign Application Priority Data

Nov. 11, 2005 (KR) .................. 10-2005-0107907

(51) Int. Cl.
*H01L 29/788* (2006.01)

(52) U.S. Cl. ...................... 257/316; 257/321
(58) Field of Classification Search ............ 257/316, 257/321
See application file for complete search history.

(56) References Cited

U.S. PATENT DOCUMENTS 6,906,377 B2 * 6/2005 Ni et al. ................ 257/315
7,420,259 B2 * 9/2008 Mori et al. .............. 257/510

FOREIGN PATENT DOCUMENTS

| JP | 11-087543 | 3/1999 |
|---|---|---|
| JP | 2002-203919 | 7/2002 |
| JP | 2002-246485 | 8/2002 |
| KR | 1020030092997 | 12/2003 |
| KR | 1020040005230 | 1/2004 |

* cited by examiner

*Primary Examiner*—Mark Prenty
(74) *Attorney, Agent, or Firm*—Myers Bigel Sibley & Sajovec, P.A.

(57) ABSTRACT

A nonvolatile memory device may include a substrate having a cell region, and a cell device isolation layer on the cell region of the substrate to define a cell active region. A floating gate may include a lower floating gate and an upper floating gate sequentially stacked on the cell active region, and a tunnel insulation pattern may be between the floating gate and the cell active region. A control gate electrode may be on the floating gate, and a blocking insulation pattern may be between the control gate electrode and the floating gate. More particularly, the upper floating gate may include a flat portion on the lower floating gate and a pair of wall portions extending upward from both edges of the flat portion adjacent to the cell device isolation layer. Moreover, a width of an upper portion of a space surrounded by the flat portion and the pair of wall portions may be larger than a width of a lower portion of the space. Related methods are also discussed.

9 Claims, 24 Drawing Sheets

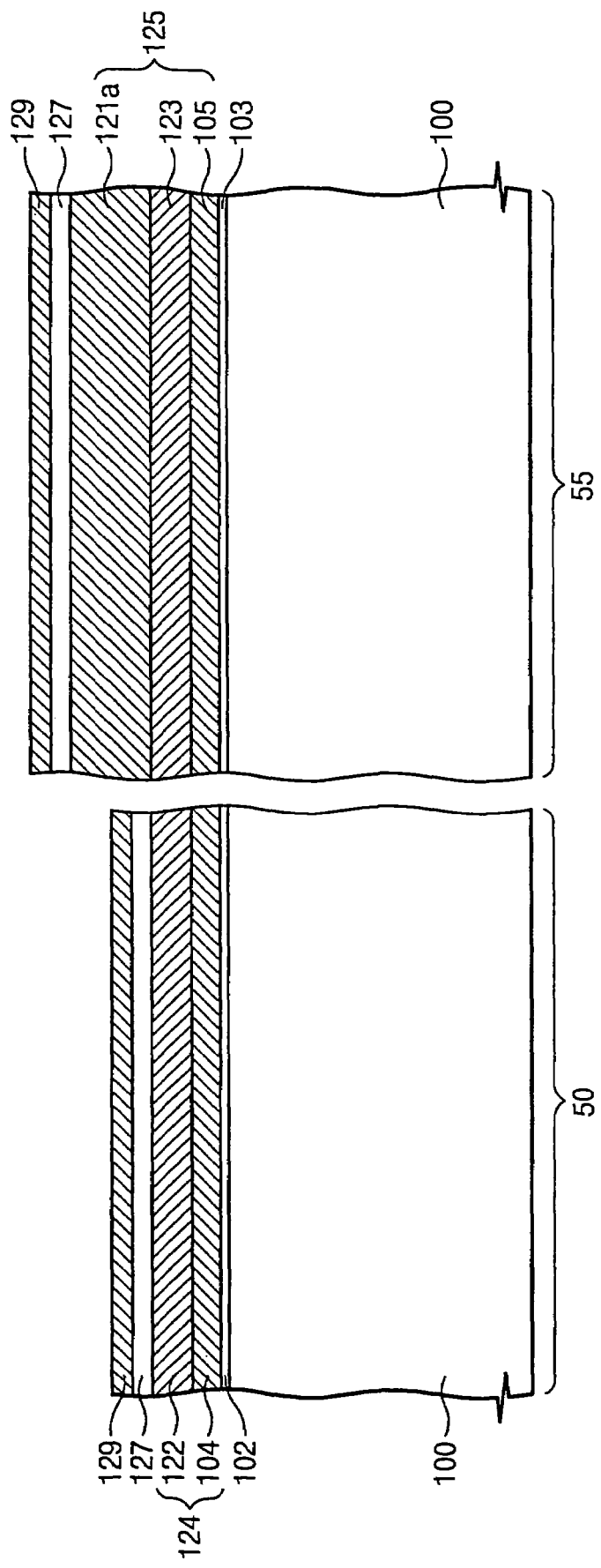

US 7,592,665 B2

NON-VOLATILE MEMORY DEVICES HAVING FLOATING GATES

RELATED APPLICATION

This application claims the benefit of priority from Korean Application No. 2005-107907 filed Nov. 11, 2005, the disclosure of which is hereby incorporated herein in its entirety by reference.

FIELD OF THE INVENTION

The present invention relates to semiconductor devices, and more particularly, to nonvolatile memory devices and related methods.

BACKGROUND

With non-volatile memory devices, stored data may be maintained even when an external power supply is interrupted. A nonvolatile flash memory device may have a floating gate, and a flash memory device may be capable of electrically writing and erasing data while providing non-volatile storage. In general, a flash memory device includes a floating gate capable of storing a charge, and a control gate electrode controlling the floating gate.

A coupling ratio of a flash memory cell may be enhanced to increase integration and to reduce power consumption. A coupling ratio can be defined as a ratio of a voltage induced at the floating gate with respect to an operating voltage applied to the control gate electrode. That is, as the coupling ratio increases, the voltage induced at the floating gate may increase. Accordingly, the operating voltage applied to the control gate electrode can be reduced by increasing the coupling ratio. By doing so, a level of integration of a flash memory device may be increased while power consumption may be reduced. The coupling ratio may be increased by increasing static capacitance between the control gate electrode and the floating gate. With highly integrated semiconductor devices, however, it may be difficult to increase static capacitance between a control gate electrode and a floating gate within a limited area. Moreover, high levels of integration may cause other problems.

At present, a stack type flash memory device may provide relatively high integration. More particularly, a stack type flash memory device has a structure such that a floating gate and a control gate electrode are sequentially stacked.

FIG. 1A is a cross sectional view of a flash memory device having a stack structure, and FIG. 1B is a sectional view taken along line I-I' of FIG. 1A.

Referring to FIGS. 1A and 1B, a device isolation layer 2 on a semiconductor substrate 1 defines an active region. Floating gates 4 are spaced apart from each other on the active region. Control gate electrodes 6 are on respective floating gates 4. The control gate electrodes 6 cross an upper surface of the active region, and the control gate electrodes 6 are arranged in parallel.

Tunnel oxide layers 3 are between the respective floating gates 4 and the active region, and ONO (oxide-nitride-oxide) layers 5 are between the respective floating gates 4 and control gate electrodes 6. That is, the floating gates 4 are electrically isolated from the active region and the control gate electrodes 6 by the tunnel oxide layers 3 and the ONO layers 5 so that the floating gates 4 are electrically isolated. Source/drain regions are formed in the active region at both sides of the floating gates 4. Each floating gate 4 has a pair of first sidewalls adjacent to the device isolation layer 2, and a pair of second sidewalls adjacent to the source/drain regions 7.

The control gate electrodes 6 cover the first sidewalls of the respective floating gates 4, with the ONO layers 5 therebetween. As a result, a static capacitance between the control gate electrode 6 and the floating gate 4 may be increased to increase a coupling ratio of the flash memory cell.

A further increase of the coupling ratio in a limited area may be provided by increasing the thickness of the floating gate 4. In this case, the area of the sidewalls of the floating gate 4 may be increased, so that static capacitance between the control gate electrodes 6 and the floating gates 4 is increased.

As the thickness of the floating gates 4 increases, an area of the second sidewalls of the floating gate 4 may also increase. As the area of the second sidewalls of the floating gates 4 increases, an overlapping area between the adjacent floating gates 4 may increase, so that a parasitic capacitance between the adjacent floating gates 4 may increase. As the parasitic capacitances increase, a failure rate of the flash memory device may increase. For example, when a write or erase operation is performed for a selected floating gate 4, another floating gate 4 adjacent to the selected floating gate 4 may be soft-written or soft-erased. Also, the parasitic static capacitance may influence the coupling ratio. That is, as the parasitic static capacitance increases, the coupling ratio may decrease.

SUMMARY

According to some embodiments of the present invention, nonvolatile memory devices and methods of manufacturing the same may reduce a parasitic static capacitance between adjacent floating gates.

According to some embodiments of the present invention, nonvolatile memory devices and methods of manufacturing the same may increase coupling ratios in limited areas.

According to still other embodiments of the present invention, nonvolatile memory devices may be adapted to provide relatively high integration and methods of manufacturing the same.

According to some embodiments of the present invention, a nonvolatile memory device may include a substrate having a cell region and a cell device isolation layer on the substrate of the cell region to define a cell active region. A floating gate may be disposed on the cell active region. The floating gate may include a lower floating gate and an upper floating gate sequentially stacked. The upper floating gate may include a flat portion on the lower floating gate and a pair of wall portions extending upward from both edges of the flat portion adjacent to a cell device isolation layer. A width of an upper portion of a space surrounded by the flat portion and the pair of wall portions may be larger than a width of a lower portion of the space. A tunnel insulation pattern may be interposed between the floating gate and the cell active region. A control gate electrode may be disposed on the floating gate, and a blocking insulation pattern may be interposed between the control gate electrode and the floating gate.

A width of a lower portion of the wall portion may be larger than a width of an upper portion of the wall portion. The control gate electrode may fill the space, interposing the blocking insulation pattern therebetween, and a width of an upper portion of a portion of the control gate electrode filling the space may be larger than a width of a lower portion of the portion of the control gate electrode filling the space. A width of the space may increase as it goes upward from a bottom thereof. The pair of wall portions may have inner side surfaces which form sidewalls of the space and are inclined, and the pair of wall portions may be symmetric with respect to each other. The control gate electrode may cover outer side surfaces of the wall portions adjacent to the cell device isolation layer. A width of the flat portion parallel to a width of a channel region below the floating gate may be larger than a width of the lower floating gate parallel to the width of the channel region.

The substrate may further include a peripheral region, and the nonvolatile memory device may further include a peripheral device isolation layer formed on the peripheral region. The peripheral device isolation layer may define a peripheral active region with a peripheral gate electrode including a lower gate electrode and an upper gate electrode sequentially stacked on the peripheral active region, and the upper gate electrode may be connected with the lower gate electrode. A peripheral gate insulation pattern may be interposed between the peripheral gate electrode and the peripheral active region. The lower gate electrode may include a first lower gate, a second lower gate and a third lower gate. The first lower gate may be disposed on the peripheral gate insulation pattern, and the second lower gate may include a peripheral flat portion disposed on the first lower gate and a pair of peripheral wall portions extending upward from both edges of the peripheral flat portion adjacent to the peripheral device isolation layer. The third lower gate may fill a hollow region surrounded by the peripheral flat portion and the pair of peripheral wall portions.

According to other embodiments of the present invention, a method of forming a nonvolatile memory device may include preparing a substrate including a cell region. A cell trench may be formed at the substrate of the cell region to define a cell active region, and a tunnel insulation pattern, a lower floating gate pattern and a cell hard mask pattern sequentially stacked on the cell active region. A cell device isolation layer may be formed filling the cell trench and surrounding side surfaces of the lower floating gate pattern and the cell hard mask pattern. The cell hard mask pattern may be removed to form a cell opening exposing the lower floating gate pattern. An upper floating gate pattern may be formed on both sidewalls and a bottom surface of the cell opening, and a cell groove surrounded by the upper floating gate pattern. A substantially conformal blocking insulation layer, and a control gate conductive layer may be sequentially formed to fill the cell groove on the substrate. The control gate conductive layer, the blocking insulation layer, the upper floating gate pattern and the lower floating gate pattern may be successively patterned, and a width of an upper portion of the cell groove may be larger than a width of a lower portion of the cell groove.

According to some other embodiments of the present invention, a nonvolatile memory device may include a substrate and an isolation layer on the substrate defining a cell active region of the substrate. A tunnel insulating layer may be on the cell active region of the substrate, and a floating gate may be on the tunnel insulating layer so that the tunnel insulating layer is between the floating gate and the cell active region of the substrate. More particularly, the floating gate may include walls on opposing sides thereof extending away from the substrate, and the walls of the floating gate may define a trench therebetween. A blocking insulating layer may be on the floating gate, and a control gate electrode may be on the blocking insulating layer so that the blocking insulting layer is between the control gate electrode and the floating gate.

According to still other embodiments of the present invention, a method of forming a nonvolatile memory device may include forming a tunnel insulating layer on a cell active region of a substrate. A floating gate may be formed on the tunnel insulating layer so that the tunnel insulating layer is between the floating gate and the cell active region of the substrate, and the floating gate may include walls on opposing sides thereof extending away from the substrate such that the walls of the floating gate define a trench therebetween. A blocking insulating layer may be formed on the floating gate, and a control gate electrode may be formed on the blocking insulating layer so that the blocking insulting layer is between the control gate electrode and the floating gate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain embodiments of the invention. In the drawings:

FIGS. 7A to 15A are sectional views taken along lines II-II' and III-III' of FIG. 2 to illustrate operations of forming nonvolatile memory devices according to embodiments of the present invention.

FIGS. 7B to 15B are sectional views taken along lines IV-IV' and V-V' of FIG. 2 to illustrate operations of forming nonvolatile memory devices according to embodiments of the present invention.

DETAILED DESCRIPTION

Figure 1A:
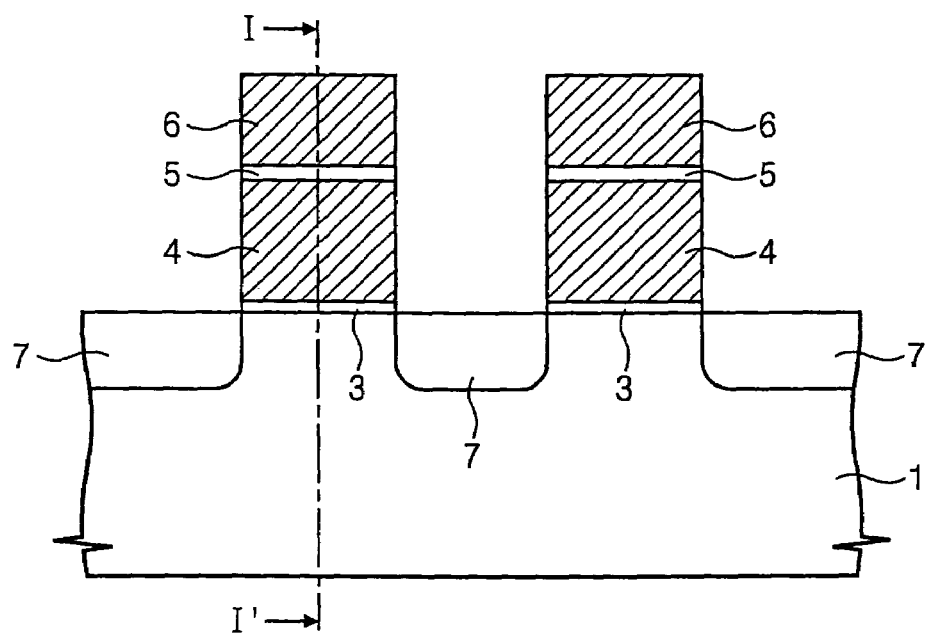
FIG. 1A is a sectional view of a conventional nonvolatile memory device having a stack structure.
Figure 1B:
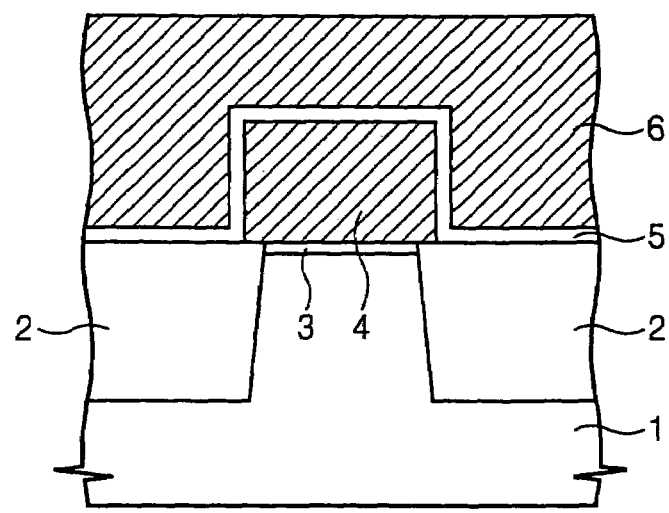
FIG. 1B is a sectional view taken along line I-I' of FIG. 1A.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

Figure 2:
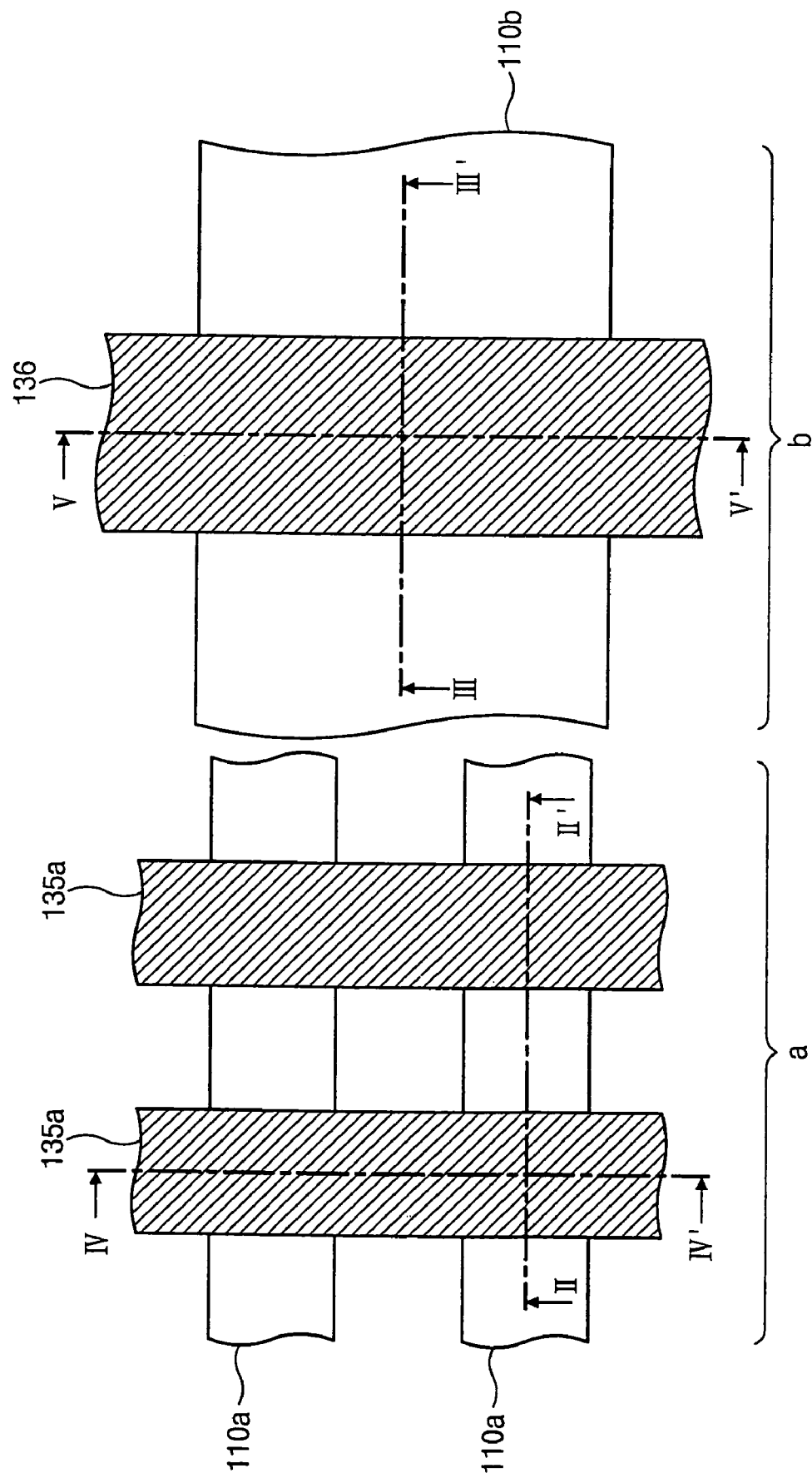
FIG. 2 is a plan view of a nonvolatile memory device structure according to embodiments of the present invention.
Figure 3:
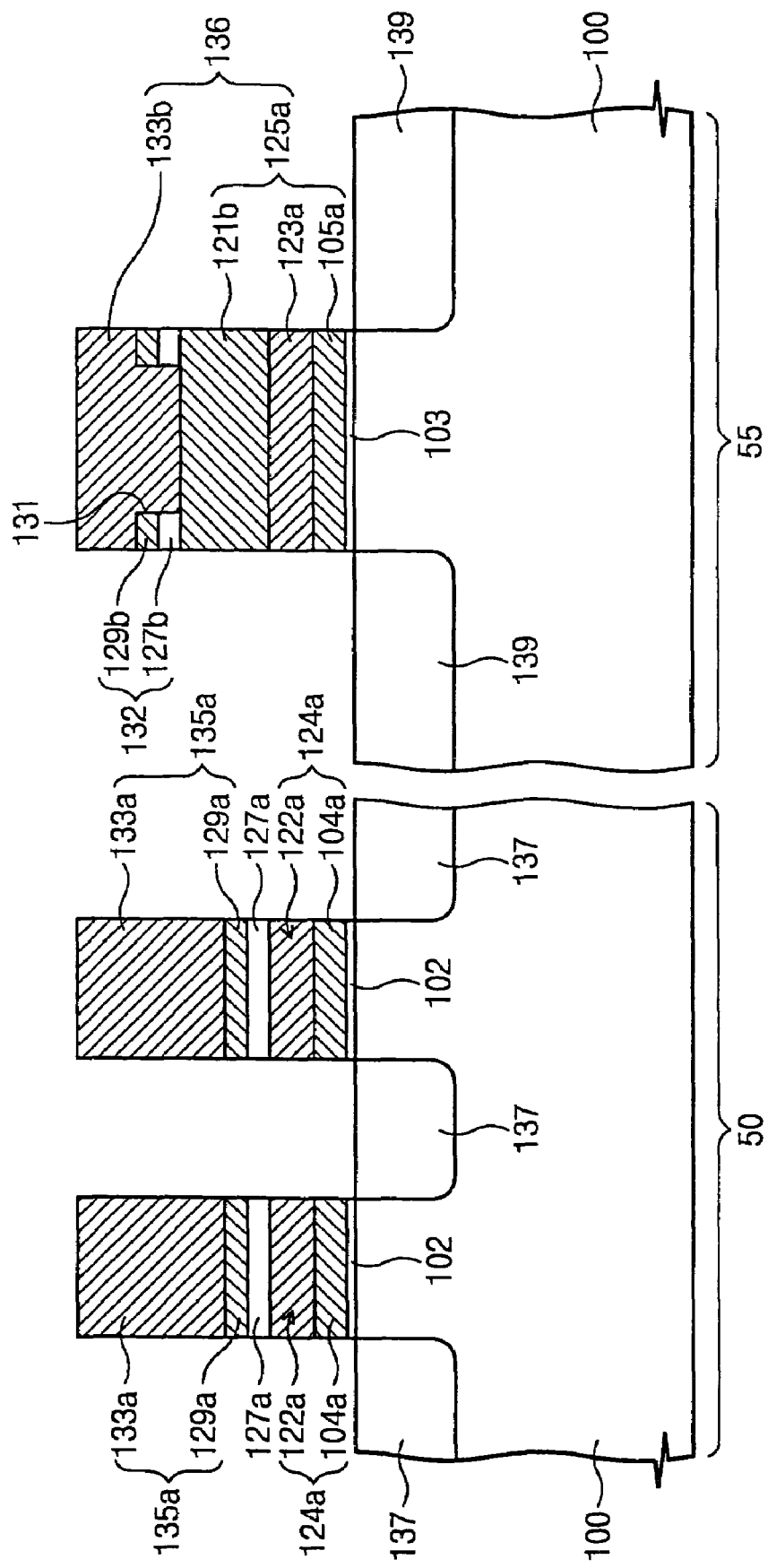
FIG. 3 is a sectional view taken along lines II-II' and III-III' of FIG. 2, respectively.
Figure 4:
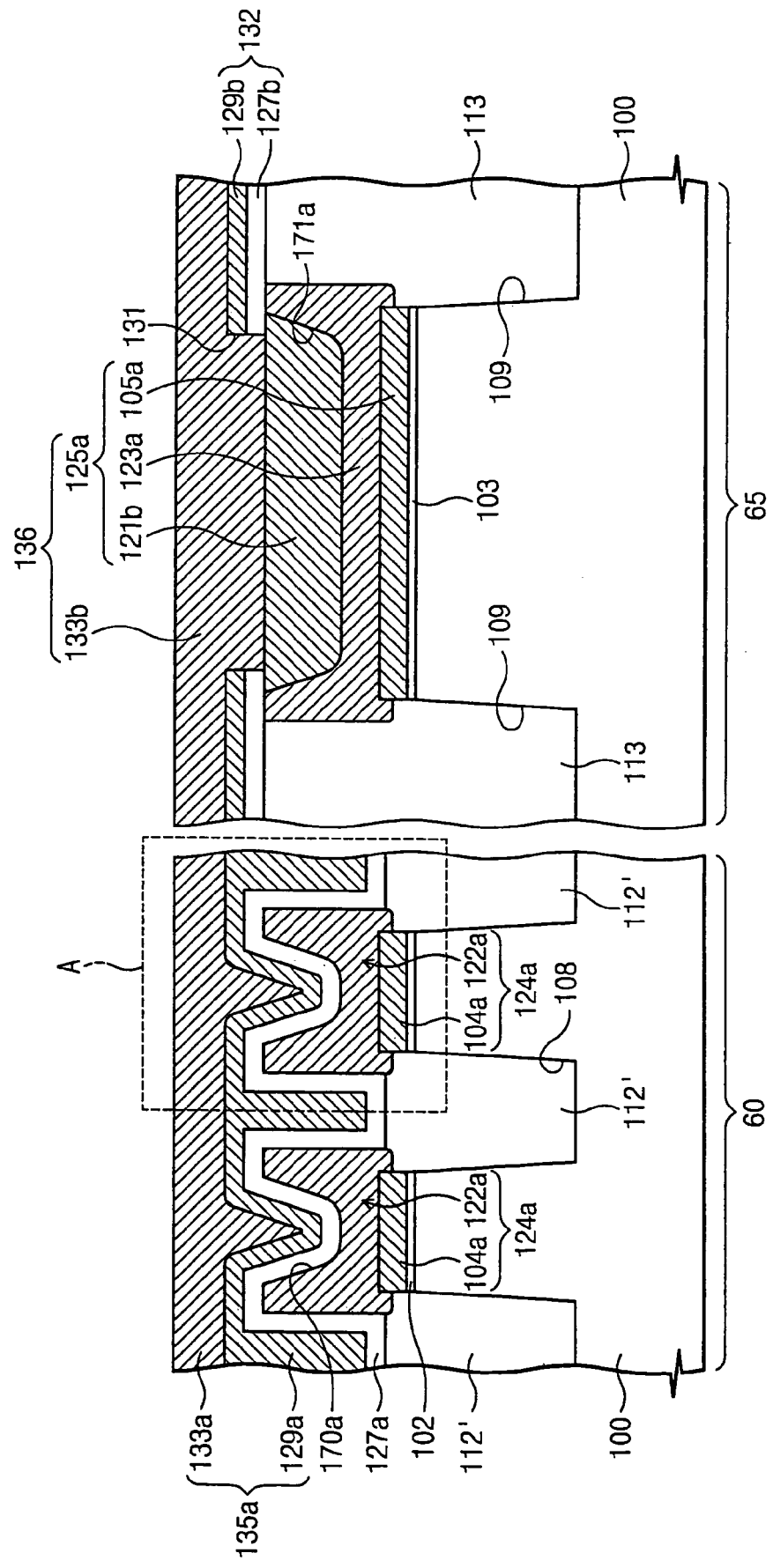
FIG. 4 is a sectional view taken along lines IV-IV' and V-V' of FIG. 2, respectively.
Figure 5:
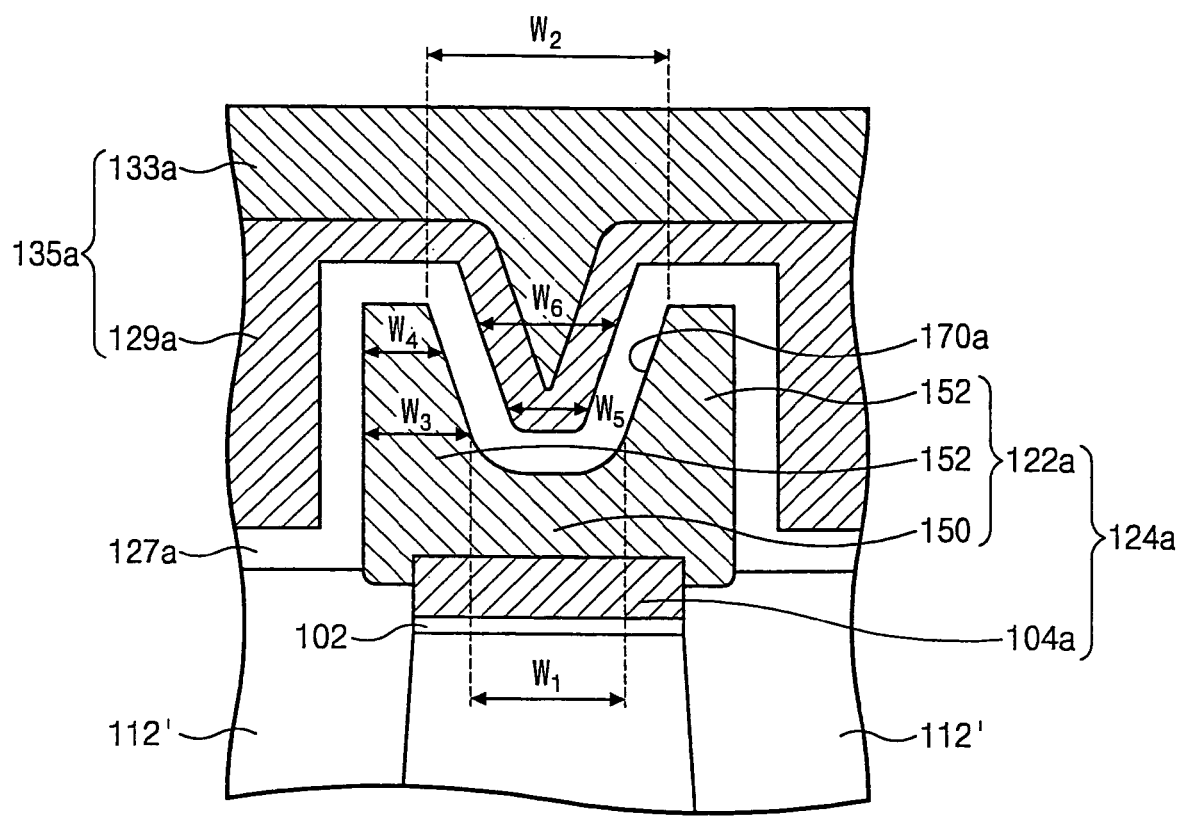
FIG. 5 is a more detailed sectional view of portion "A" in FIG. 4.

FIG. 2 is a plan view of nonvolatile memory devices according to embodiments of the present invention, FIG. 3 is a sectional view taken along lines II-II' and III-III' of FIG. 2, FIG. 4 is a sectional view taken along lines IV-IV' and V-V' of FIG. 2, and FIG. 5 is a more detailed sectional view of portion "A" in FIG. 4.

Referring to FIGS. 2, 3, 4 and 5, a semiconductor substrate 100 (hereinafter referred to as 'substrate') includes a cell region 'a' and a peripherall region 'b'. Nonvolatile memory cells are arranged on the cell region 'a', and a peripheral circuit(s) is arranged on the peripheral region 'b'. The peripheral region 'b' may include a region enclosing cell blocks and a core region between the cell blocks.

Reference numeral "50" of FIG. 3 indicates a sectional view taken along line II-II' included in the cell region 'a' of FIG. 2, and reference numeral "55" of FIG. 3 indicates a sectional view taken along line III-III' included in the peripheral region 'b' of FIG. 2. Reference numeral "60" of FIG. 4 indicates a sectional view taken along line IV-IV' included in the cell region 'a' of FIG. 2, and reference numeral "65" of FIG. 4 indicates a sectional view taken along line V-V' included in the peripheral region 'b' of FIG. 2. Reference numerals "50" and "60" are thus included in the cell region 'a' and reference numerals "55" and "65" are thus included in the peripheral region 'b'. Hereinafter, the cell region is expressed as the reference symbol 'a' and/or reference numeral(s) 50 and/or 60 and the peripheral region is expressed as the reference symbol 'b' and/or reference numeral(s) 55 and/or 65 for the convenience of description.

A cell device isolation layer 112' may be disposed in the cell region 'a' to define cell active regions 110a. The cell active regions 110a may be in the form of lines arranged in the plane of the substrate in parallel. Moreover, the cell device isolation layer 112' may fill a cell trench(es) 108 formed in the substrate 100 in the cell region 'a'. A peripheral device isolation layer 113 may be provided in the substrate 100 in the peripheral region 'b' to define a peripheral active region 110b. The peripheral device isolation layer 113 may fill a peripheral trench 109 formed in the substrate in the peripheral region 'b'.

Control gate electrodes 135a are arranged in parallel to cross over the cell active regions 110a, and the control gate electrodes 135a are spaced apart from each other. A floating gate 124a is provided between the control gate electrode 135a and the cell active region. A tunnel insulation pattern 102 is provided between the floating gate 124a and the cell active region 110a, and a blocking insulation pattern 127a is provided between the floating gate 124a and the control gate electrode 135a. Cell source/drain regions 137 are formed in the cell active regions at both sides of the control gate electrodes 135a.

The floating gate 124a includes a lower floating gate 104a and an upper floating gate 122a which are sequentially stacked. The tunnel insulation pattern 102 is provided between the lower floating gate 104a and the cell active region 110a. The lower floating gate 104a has a sidewall aligned with a sidewall of the cell trench 108.

The upper floating gate 122a includes a flat portion 150 on the lower floating gate 104a, and a pair of wall portions 152 extending upwardly (i.e., away from the substrate) from both edges of the flat portion 150. The pair of wall portions 152 extend upwardly from both edges of the flat portion 150 adjacent to the cell device isolation layer 112'. The pair of wall portions 152 of a same floating gate are spaced apart from each other. A space 170a (also referred to as a trench) is defined by the flat portion 150 and the pair of wall portions 152. The control gate electrode 135a and a blocking insulation pattern 127a fill the space 170a. Both sides of the space 170a adjacent to the cell device isolation layer 112' may be closed by the pair of wall portions 152. Since the pair of wall portions 152 are spaced apart from each other, a middle portion of an upper surface of the flat portion 150 defines a bottom of the space 170a. Stated in other words, the wall portions 152 of the upper floating gate 122a may define a trench therebetween, and a width of the trench may increase with increasing distance from the substrate as indicated by the widths $W_1$ and $W_2$.

A first width 'W1' of a lower portion of the space 170a may be smaller than a second width 'W2' of an upper portion of the space 170a. In particular, the width of the space 170a may increase gradually with increasing distance from the bottom of the space 170a. The wall portions 152 have inner side surfaces forming sidewalls of the space and outer side surfaces adjacent to the cell device isolation layer 112'. The pair of wall portions 152 of an upper floating gate 122a may have a symmetric structure and the inner side surfaces of the wall portions 152 may be inclined. The first width 'W1' of the space 170a corresponds to a distance between the lower inner side surfaces, and the second width 'W2' of the space 170a corresponds to a distance between the upper inner side surfaces. That is, the inner side surfaces of the pair of wall portions 152 are inclined such that the first width 'W1' is smaller than the second width 'W2'.

A third width 'W3' of a lower portion of each wall portion 152 is larger than a fourth width 'W4' of an upper portion of each wall portion 152. A fifth width 'W5' of a lower portion of the control gate electrode 135a filling the space 170a is smaller than a sixth width 'W6' of an upper portion of the control gate electrode 135a filling the space 170a.

The width of the flat portion 150 may be larger than the width of the lower floating gate 104a. Accordingly, a distance between the outer side surfaces of the pair of wall portions 152 may be larger than the width of the lower floating gate 104a. The aforementioned widths 'W1, W2, W3, W4, W5, W6', the width of the flat portion 150, and the width of the lower floating gate 104a are parallel with a width of a channel region below the floating gate 124a. Side surfaces of the lower floating gate 104a adjacent to the cell source/drain region 137, side surfaces of the upper floating gate 122a, side surfaces of the blocking insulation pattern 127a, and side surfaces of the control gate electrode 135a are aligned with one another as shown in FIG. 3.

An upper surface of the cell device isolation layer 112' may have a height adjacent to the lowest surface of the upper floating gate 122a. In particular, the upper surface of the cell device isolation layer 112' may be higher than the lower surface of the lower floating gate 104a and lower than the upper surface of the lower floating gate 104a. In the event that the upper surface of the cell device isolation layer 112' has a height adjacent to the lower surface of the upper floating gate 122a, the control gate electrode 135a may cover a portion of a side surface of the lower floating gate 104a.

The control gate electrode 135a and the blocking insulation pattern 127a may cover outer surfaces of the wall portions 152. That is, the control gate electrode 135a and the blocking insulation pattern 127a may cover the inner side surface, the outer side surface of the wall portion 152 and the upper surface of the flat portion 150 defining the bottom of the space 170a. In addition, the control gate electrode 135a may cover portions of side surfaces of the lower floating gate 104a. Accordingly, an overlapping area between the control gate electrode 135a and the floating gate 124a within a limited area may increase, so that the coupling ratio may increase.

The control gate electrode 135a may include a lower control gate 129a and an upper control gate 133a sequentially stacked. In this case, the space 170a may be filled with some of the lower control gate 129a and some of the upper control gate 133a. In an alternative, the lower control gate 129a can be omitted so that the control gate electrode 135a may include only the upper control gate 133a, and the space 170a may be filled by the upper control gate 133a and the blocking insulation pattern 127a.

Referring to FIGS. 2, 3, 4 and 5, a peripheral gate electrode 136 may cross over the peripheral active region 110b. A peripheral gate insulation pattern 103 may be provided between the peripheral gate electrode 116 and the peripheral active region 110b. The peripheral gate electrode may 136 include a lower gate electrode 125a and an upper gate electrode 133b that are sequentially stacked. Peripheral source/drain regions 139 may be formed in the peripheral active regions at both sides of the peripheral gate electrode 136.

The lower gate electrode 125a may include a first lower gate 105a, a second lower gate 123a and a third lower gate 121b. The first lower gate 105a may have sidewalls aligned with sidewalls of the peripheral trenches 109. The second lower gate 123a may be similar in shape to the upper floating gate 122a. More particularly the second lower gate 123a may include flat portion on the first lower gate 105a, and a pair of peripheral wall portions extending upwardly from opposite edges of the flat portion adjacent to the peripheral device isolation layers 113. The pair of peripheral wall portions may be spaced apart from each other. A hollow region 171a (also referred to as a trench) defined by the flat portion and the peripheral wall portions may be open in a direction away from the substrate, and both sides of the hollow region 171a adjacent to the peripheral source/drain regions 139 may also be open. Both sides of the hollow region 171a adjacent to the peripheral device isolation layers 113 may be closed by the peripheral wall portions. Stated in other words, the peripheral wall portions of the second lower gate 123a may define a trench therebetween.

A spacing distance between the pair of peripheral wall portions may be larger than a spacing distance between the pair of wall portions 152. A width of a lower portion of the hollow region 171a may be less than a width of an upper portion of the hollow region 171a. The width of the hollow region 171a may gradually increase as it goes upward (away from the substrate) from a bottom of the hollow region 171a. The pair of peripheral wall portions may have a symmetric structure, and inner side surfaces defining sidewalls of the hollow region 171a of the peripheral wall portions may be inclined The inner side surfaces of the peripheral wall portions may be inclined at a first angle with respect to an imaginary vertical line normal to the upper surface of the substrate 100. The inner side surfaces of the wall portions 152 of the upper floating gate 122a may be inclined at a second angle with respect to the imaginary vertical line. Moreover, the first angle may be less than the second angle. In addition, the width of the flat portion of the second lower gate 123a may be larger than the width of the first lower gate 105a. The widths related with the aforementioned peripheral gate electrode 136 are distances parallel to a width of a channel region below the peripheral gate electrode 136.

The third lower gate 121b may fill the hollow region 171a. More particularly, an upper surface of the third lower gate 121b may have a height which is the same as upper surfaces of the peripheral wall portions of the second lower gate 121b. Upper portions of the peripheral device isolation layers 113 may protrude higher than the upper surface of the substrate 100. Accordingly, the peripheral device isolation layers 113 may contact outer surfaces of the second lower gate 123a (i.e., outer side surfaces of the peripheral wall portions). In this case, the upper surfaces of the peripheral device isolation layers 113 may have a same height as the upper surface of the third lower gate 121b.

The first lower gate 105a may be formed of the same material as the lower floating gate 104a. More particularly, the first lower gate 105 and the lower floating gate 104a may be patterned from one conductive layer. The second lower gate 123a may be formed of the same material as the upper floating gate 122a. More particularly, the second lower gate 123a and the upper floating gate 122a may be patterned from one conductive layer.

The upper gate electrode 133b may contact a predetermined region of an upper surface of the lower gate electrode 125a. The upper gate electrode 133b may be disposed on the lower gate electrode 125a to cross over the peripheral active region 119b. That is, the upper gate electrode 133b can pass over the peripheral device isolation layers 113 and over the peripheral active region 110b. The control gate electrode 135a may include the same material as that of the upper gate electrode 133b. More particularly, the upper gate electrode 133b may be formed of the same material as the upper control gate electrode 133a. That is, the upper gate electrode 133b and the upper control gate electrode 133a may be patterned from one conductive layer.

A residual pattern 132 may be provided between portions of the upper gate electrode 133b and the lower gate electrode 125a. At this time, the upper gate electrode 133b can penetrate the residual pattern 132 and fill a contact opening 131 exposing the lower gate electrode 125a to electrically contact the lower gate electrode 125a. The contact opening 131 may be in the form of a hole or in the form of a groove exposing portions of an upper surface of the lower gate electrode 125a.

The residual pattern 132 may include a first layer 127b and a second layer 129b that are sequentially stacked. The first layer 127b of the residual pattern 132 may be formed of the same material as the blocking insulation pattern 127a. The second layer 129b of the residual pattern 132 may be formed of the same material as the lower control gate 129a. If the lower control gate 129a is omitted, the residual pattern 132 may include only the first layer 127b.

In an alternative, the residual pattern 132 may be omitted from the peripheral region 'b'. In this case, the upper gate electrode 133b may contact an entire upper surface of the lower gate electrode 125a.

Side surfaces of the first lower gate 105a adjacent to the peripheral source/drain regions 139, side surfaces of the second lower gate 123a, side surfaces of the third lower gate 121b, the residual pattern 132, and side surfaces of the upper gate electrode 133b may be aligned with one another.

In a nonvolatile memory device having the structure illustrated in FIGS. 2-4, the floating gate 124a includes the upper floating gate 122a defining the space 170a. Accordingly, an area of the side surfaces of the floating gate 124a adjacent to the cell source/drain regions 137 may be reduced due to the opened side area of the space 170a. As a result, an overlapping area between adjacent floating gates 124a may be reduced, and parasitic static capacitance between the adjacent floating gates 124a may be reduced.

Also, the control gate electrode 135a may fill the space 170a to cover both sidewalls and a bottom of the space 170a. Additionally, the control gate electrode 135a may cover outer side surfaces of the upper floating gate 122a. Accordingly, an overlapping area between the control gate electrode 135a and the floating gate 125a may be increased to thereby increase the coupling ratio.

In addition, the second width 'W2' of the upper portion of the space 170a may be greater than the first width 'W1' of the lower portion of the space 170a. An aspect ratio of the space 170a may thus be reduced. As a result, the control gate electrode 135a may more easily fill the space 170a.

Furthermore, the third width 'W3' of the lower portion of the wall portion 152 of the floating gate 122a may be larger than the fourth width 'W4' of the upper portion of the wall portion 152 of the floating gate 122a. Accordingly, it may be possible to decrease at least the depletion region formed in the lower portion of the wall portion 152 during programming/erasing operations of the nonvolatile memory device. As a result, programming/erasing speeds of the nonvolatile memory device may be enhanced. Also, the sixth width 'W6' corresponding to a width of an upper portion of the portion of the control gate electrode 135a filling the space 170a may be larger than the fifth width 'W5'. Accordingly, it may be possible to decrease at least a depletion region formed within the upper portion of the portion of the control gate electrode 135a filling the space 170a during programming/erasing operations of the nonvolatile memory device. As a result, programming/erasing speeds of the nonvolatile memory device may be further enhanced.

Also, the third lower gate 121b may fill the hollow region 171a of the second lower gate 123a. Accordingly, a step height difference of the peripheral region 'b' caused by the hollow region 171a of the second lower gate 123a may be reduced.

Figure 6:
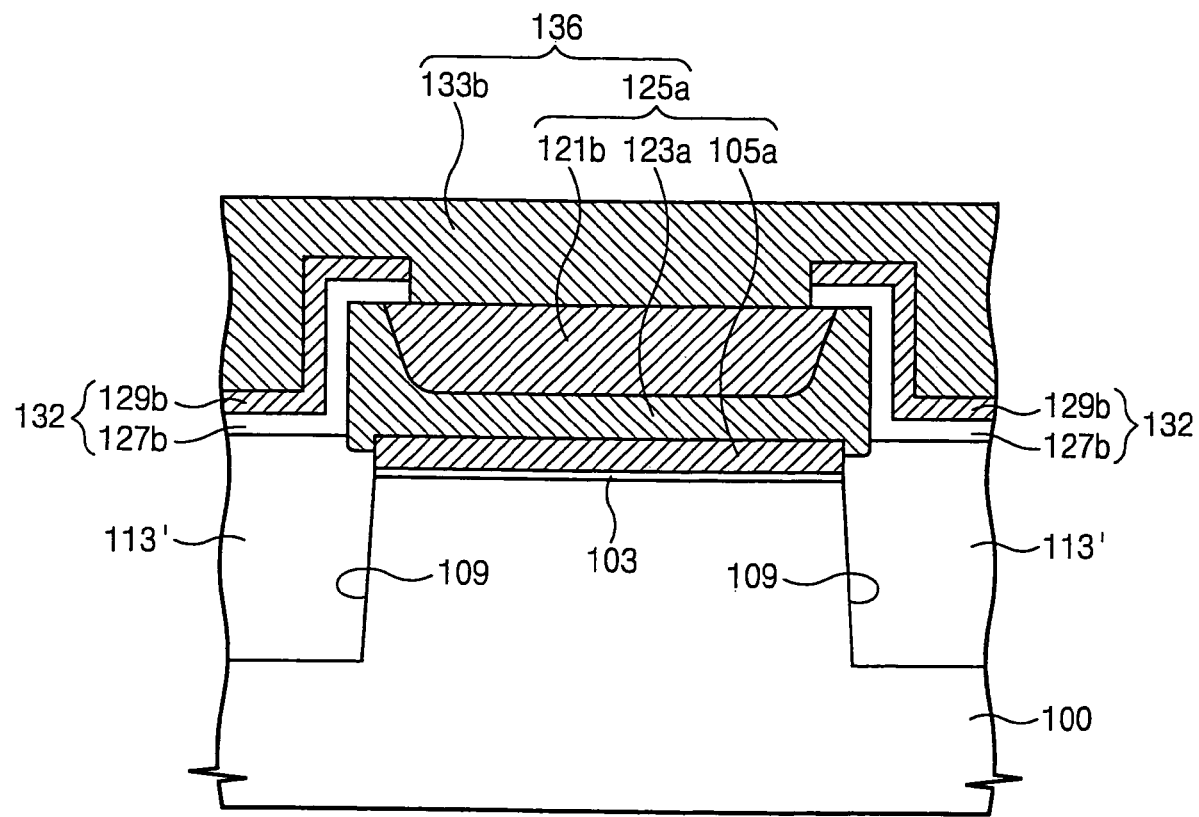
FIG. 6 is a sectional view taken along line V-V' of FIG. 2 to illustrate a modified nonvolatile memory device structure according to embodiments of the present invention.

Also, the peripheral device isolation layer 113 may not surround the outer side surfaces of the second lower gate 123a, as will be discussed in greater detail with reference to FIG. 6. FIG. 6 is a cross sectional view taken along line V-V' of FIG. 2 illustrating a modified nonvolatile memory device according to other embodiments of the present invention.

Referring to FIG. 6, upper surfaces of peripheral device isolation layers 113' may have a height close to a lowest surface of the second lower gate 123a. In particular, upper surfaces of the peripheral device isolation layers 113' may be higher than lower surfaces of the first lower gate 105a and may also be lower than upper surfaces of the first lower gate 105a. In this case, the upper gate electrode 133b may cover outer side surfaces of the second lower gate 123a. If a residual pattern 132 is not provided between the upper gate electrode 133b and the lower gate electrode 125a, the upper gate electrode 133b may contact outer side surfaces of the second lower gate 123a.

Methods of forming nonvolatile memory devices according to embodiments of the present invention will now be described.

FIGS. 7A to 15A are cross sectional views taken along lines II-II' and III-III' of FIG. 2 and FIGS. 7B to 15B are cross sectional views taken along lines IV-IV' and V-V' of FIG. 2 to illustrate methods of forming nonvolatile memory devices according to embodiments of the present invention.

Figure 7A:
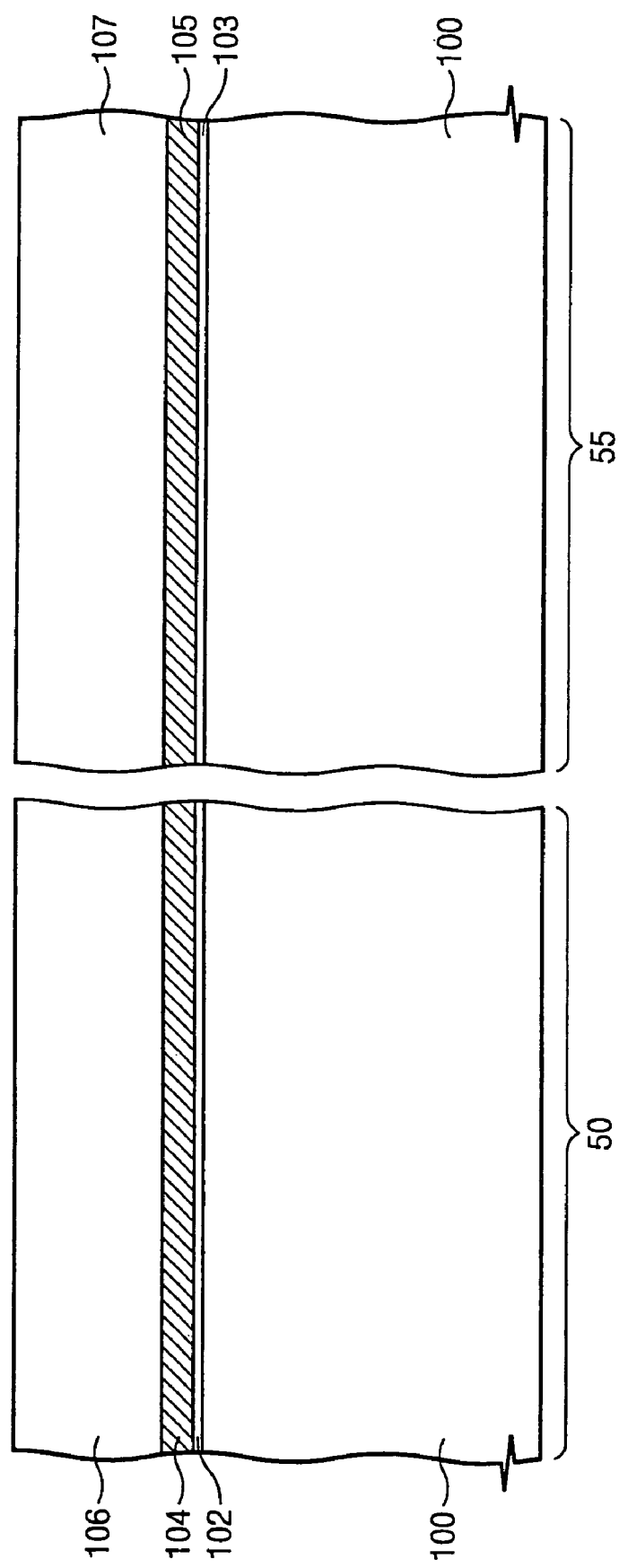
Figure 7B:
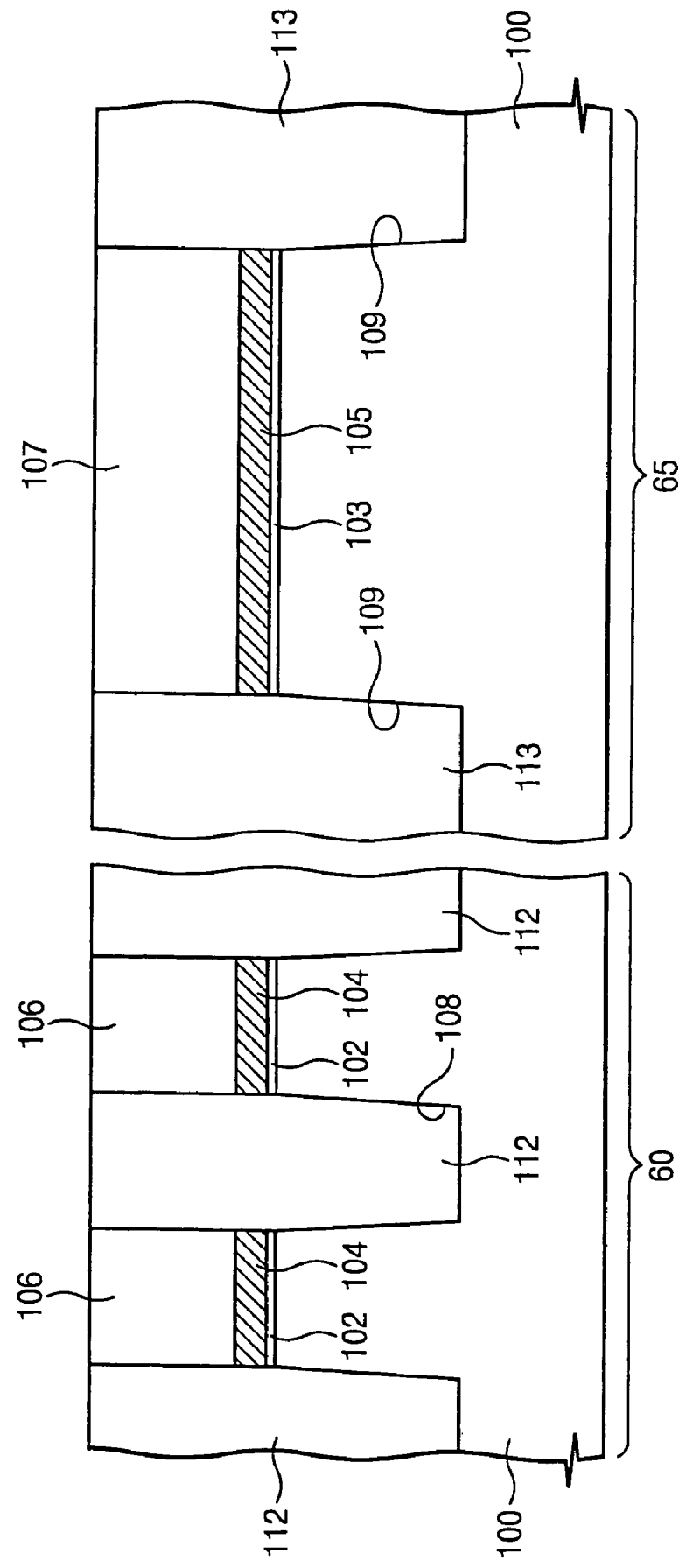

Referring to FIGS. 7A and 7B, a substrate 100 having a cell region 50, 60 and a peripheral region 55, 65 is prepared. A tunnel insulation layer is formed on the cell region 50, 60 of the substrate 100, and a peripheral gate insulation layer is formed on the peripheral region 55, 65 of the substrate 100. The tunnel insulation layer and the peripheral gate insulation layer may be formed with a same thickness. According to other embodiments, the tunnel insulation layer and the peripheral gate insulation layer may be formed with different thicknesses. For example, the peripheral gate insulation layer can be formed thicker than the tunnel insulation layer.

A method of forming the tunnel insulation layer and the peripheral gate insulation layer with different thicknesses will be described. First, the peripheral gate insulation layer may be formed on an entire upper surface of the substrate 100, and portions of the peripheral gate insulation layer on the cell region 50, 60 may be removed to expose portions of the substrate 100 at the cell region 50, 60. Thereafter, the tunnel insulation layer may be formed on the exposed portions of substrate 100 at the cell region 50, 60.

If the tunnel insulation layer and the peripheral gate insulation layer are formed with a same thickness, the tunnel insulation layer and the peripheral gate insulation layer can be simultaneously formed. The tunnel insulation layer and the peripheral gate insulation layer may be formed of a silicon oxide, such as, a thermal oxide.

A first gate conductive layer and a hard mask layer may be formed on an entire upper surface of the substrate 100 having the tunnel insulation layer and the peripheral gate insulation layer. The first gate conductive layer 104, 105 may be formed of a doped polysilicon. The hard mask layer may include a material having an etch selectivity with respect to the substrate 100. In addition, the hard mask layer can include a material having an etch selectivity with respect to the first gate conductive layer. For example, the hard mask layer may include a nitride and/or an oxynitride layer.

Portions of the hard mask layer, the first gate conductive layer and the tunnel insulation layer in the cell region 50, 60 may be successively patterned until portions of the substrate 100 are exposed, to form a tunnel insulation pattern 102, a lower floating gate pattern 104 and a cell hard mask pattern 106 that are sequentially stacked. The hard mask layer, the first gate conductive layer and the tunnel insulation layer in the peripheral region 55 and 65 may be successively patterned until portions of the substrate 100 are exposed to form a peripheral gate insulation pattern 103, a first lower gate pattern 105 and a peripheral hard mask pattern 107 that are sequentially stacked. Patterning processes of forming the cell hard mask pattern 106 and the peripheral hard mask pattern 107 may be performed simultaneously.

The substrate 100 may be etched using the cell hard mask pattern 106 and the peripheral hard mask pattern 107 as etch masks, to form a cell trench(es) 108 in the cell region 50 and 60 and a peripheral trench(es) 109 in the peripheral region 55 and 65. The cell trench(es) 108 may be formed in the cell region 50 and 60 to define the cell active regions 110a of FIG. 2 and the peripheral trench(es) 109 may be formed in the peripheral region 55 and 65 to define the peripheral active region of FIG. 2. The cell active regions 110a may thus be formed in self-alignment with the lower floating gate pattern 104 and the peripheral active region 110b may be formed in self-alignment with the first lower gate pattern 105. The lower floating gate pattern 104 may thus cover an entire surface of the cell active regions 110a and the first lower gate pattern 105 may cover an entire surface of the peripheral active region 110b.

An insulation layer filling the trenches 108 and 109 may be formed on an entire upper surface of the substrate 100 and then the insulation layer may be planarized until the hard mask patterns 106 and 107 are exposed, to form a cell device isolation layer 112 filling the cell trench(es) 108 and a peripheral device isolation layer 113 filling the peripheral trench(es) 109. The cell device isolation layer 112 may surround side surfaces of the tunnel insulation pattern 102, the lower floating gate pattern 104 and the cell hard mask pattern 106. Similarly, the peripheral device isolation layer 113 may surround side surfaces of the peripheral gate insulation pattern 103, the first lower gate pattern 105 and the peripheral hard mask pattern 107. The cell and peripheral device isolation layers 112 and 113 may be formed of an insulation material having an etch selectivity with respect to the hard mask patterns 106 and 107. In addition, the cell and peripheral device isolation layers 112 and 113 may be formed of an insulation material having a relatively good gap-filling property. For example, the cell and peripheral device isolation layers may be formed of a high-density plasma oxide.

Figure 8A:
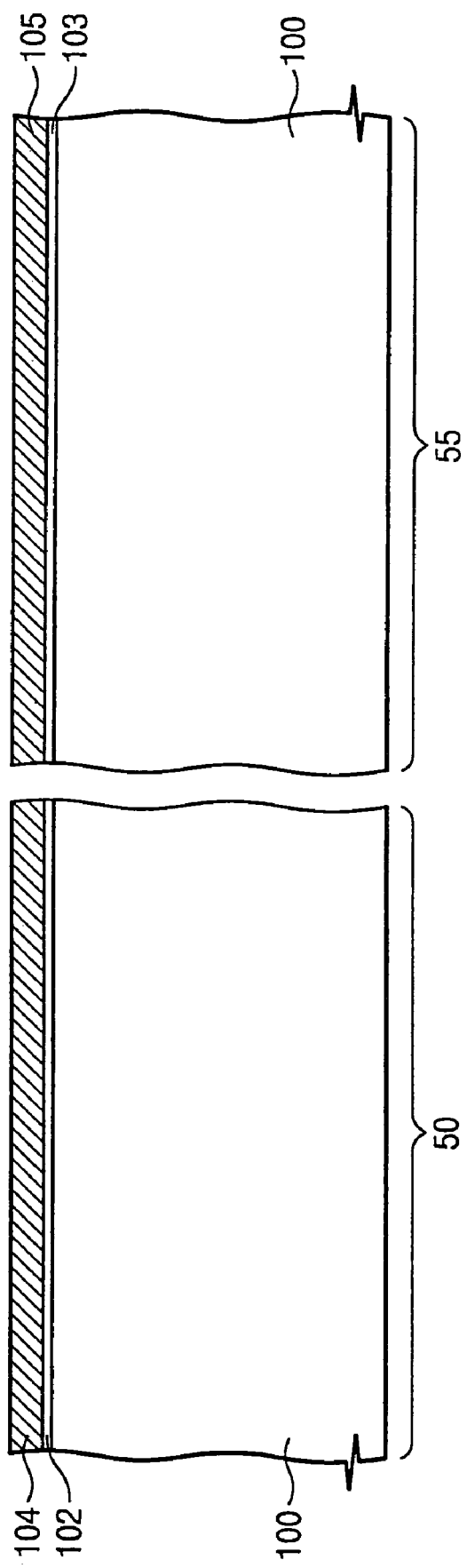
Figure 8B:
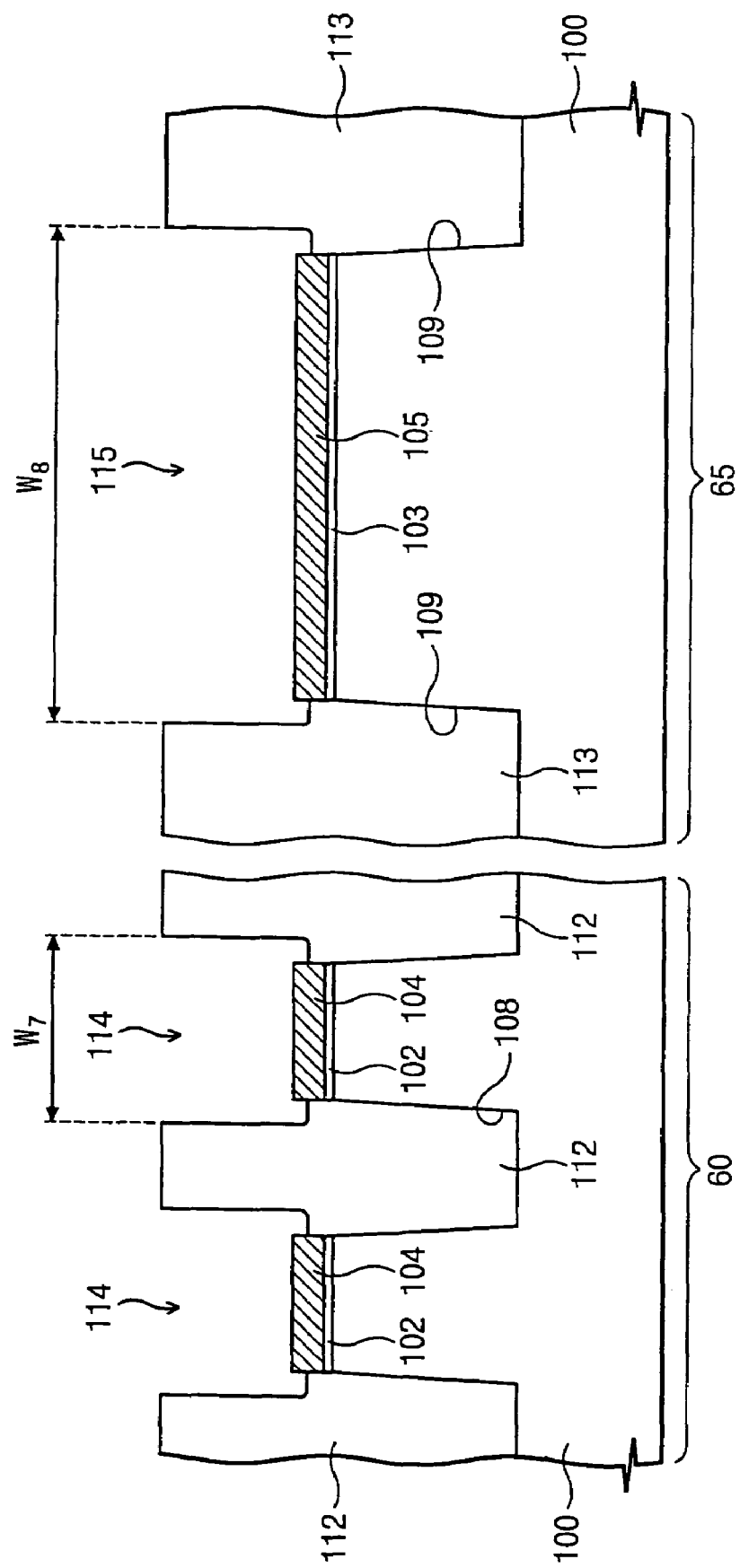

Referring to FIGS. 8A and 8B, the hard mask patterns 106 and 107 may be selectively removed to form cell openings 114 exposing the lower floating gate patterns 104 and a peripheral opening 115 exposing the first lower gate pattern 105. The cell opening 114 may be surrounded by an upper portion of the cell device isolation layer 112 protruding higher than the upper surface of the substrate 100, and the peripheral opening 115 may be surrounded by an upper portion of the peripheral device isolation layer 113 protruding higher than the upper surface of the substrate 100. A width 'W7' of the cell opening 114 may be less than a width 'W8' of the peripheral opening 115, and a channel width of a transistor formed in the peripheral region may-be greater than a channel width of a nonvolatile memory cell formed in the cell region.

After the hard mask patterns 106 and 107 are removed, a process of isotropically etching the upper portions of the cell and peripheral device isolation layers 112 and 113 can be performed. By doing so, the width 'W7' of the cell openings 114 may be greater than the width of the cell active region (i.e., width of the lower floating gate pattern 104) parallel to the width 'W7', and the width 'W8' of the peripheral opening 115 may be greater than the width of the peripheral active region (i.e., width of the first lower gate pattern 105) parallel to the width 'W8'.

Figure 9A:
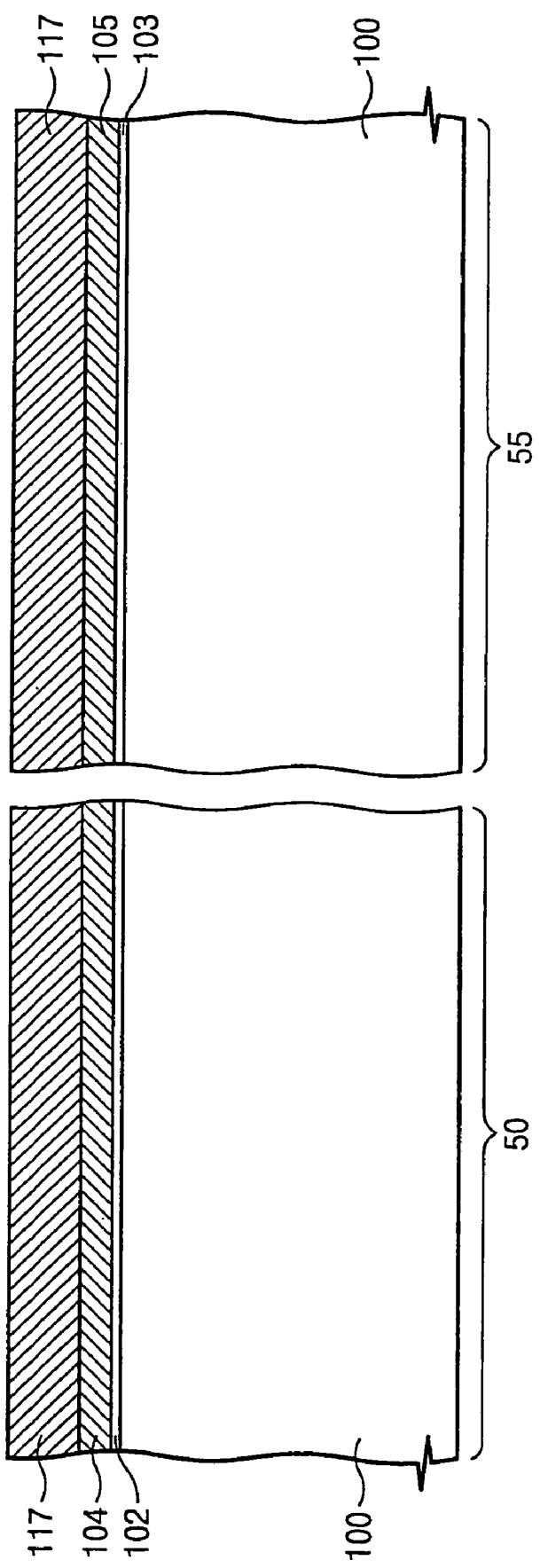
Figure 9B:
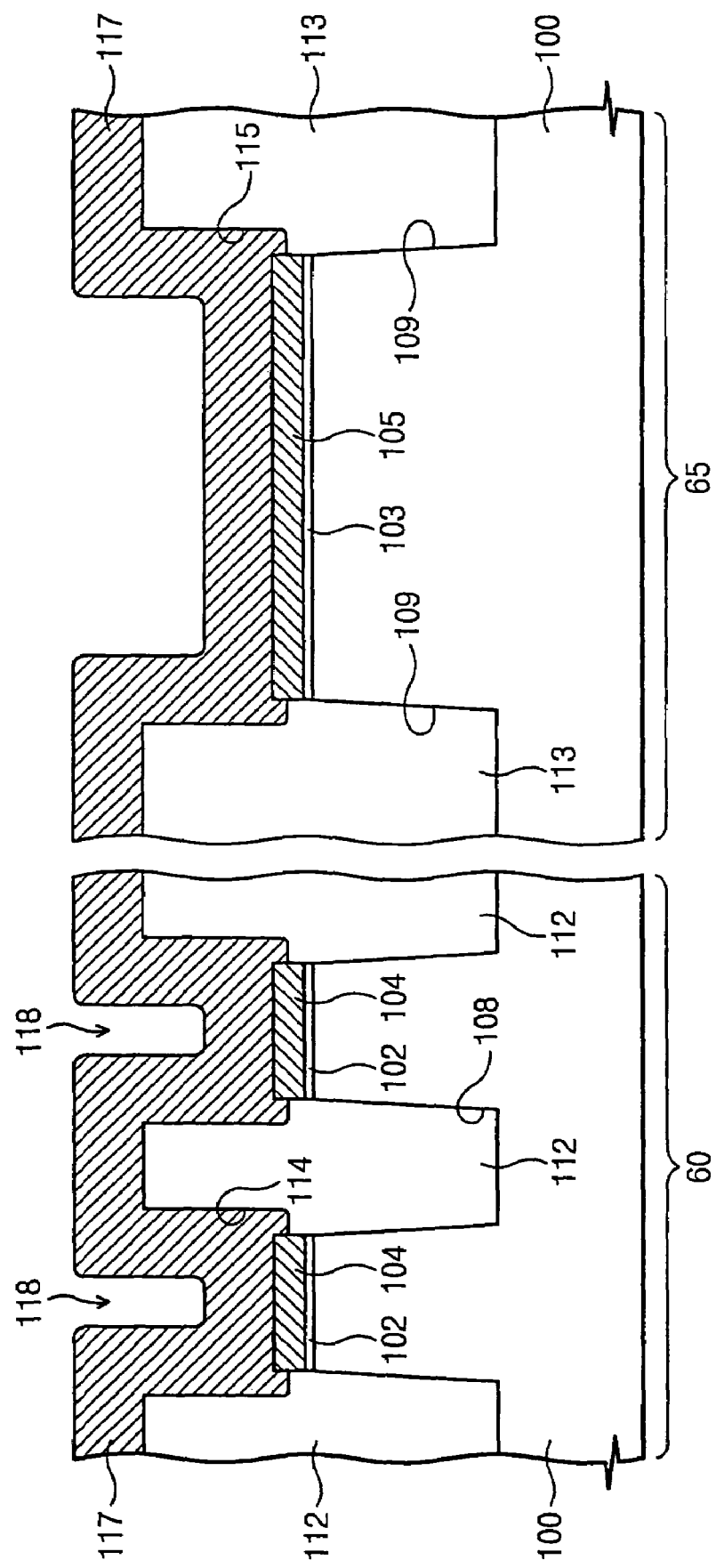

Referring to FIGS. 9A and 9B, a second gate conductive layer 117 may be conformally formed on the substrate having the openings 114 and 115. The second gate conductive layer 117 may contact the lower floating gate pattern 104 and the lower floating gate pattern 105 so that electrical connection is provided. The second gate conductive layer 117 may be formed of a doped silicon. The second gate conductive layer 117 may be conformally formed on a bottom and both sidewalls of the cell openings 114, on a bottom and both sidewalls of the peripheral opening 115, and on upper surfaces of the cell and peripheral device isolation layers 112 and 113. At this time, portions of the second gate conductive layer 117 on opposing sidewalls of a same cell opening 114 may be spaced apart to form a gap region 118. Of course, since the width 'W8' of the peripheral opening 115 is larger than the width 'W7' of the peripheral openings 114, portions of the second gate conductive layer 117 respectively formed on both sidewalls of the peripheral opening 115 are also spaced apart from each other.

Figure 10A:
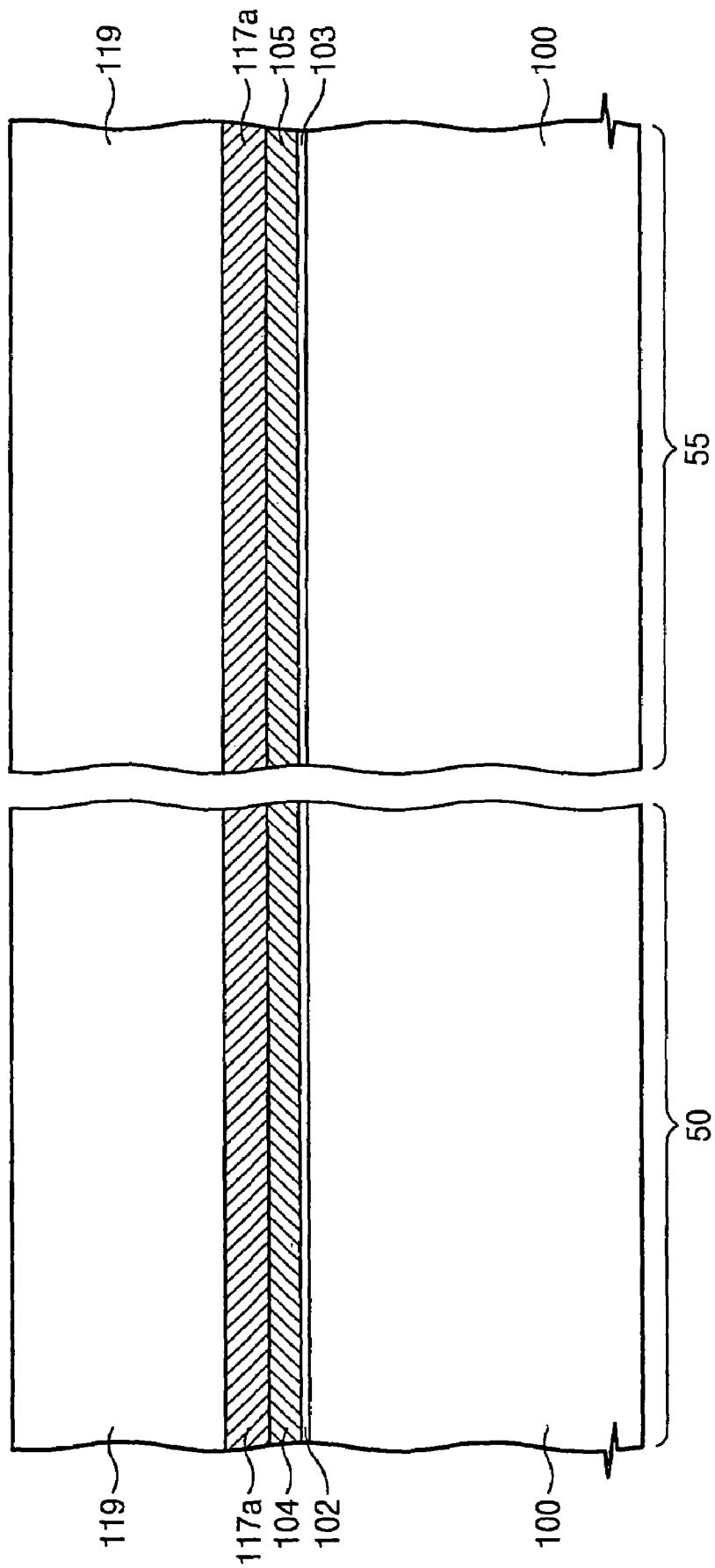
Figure 10B:
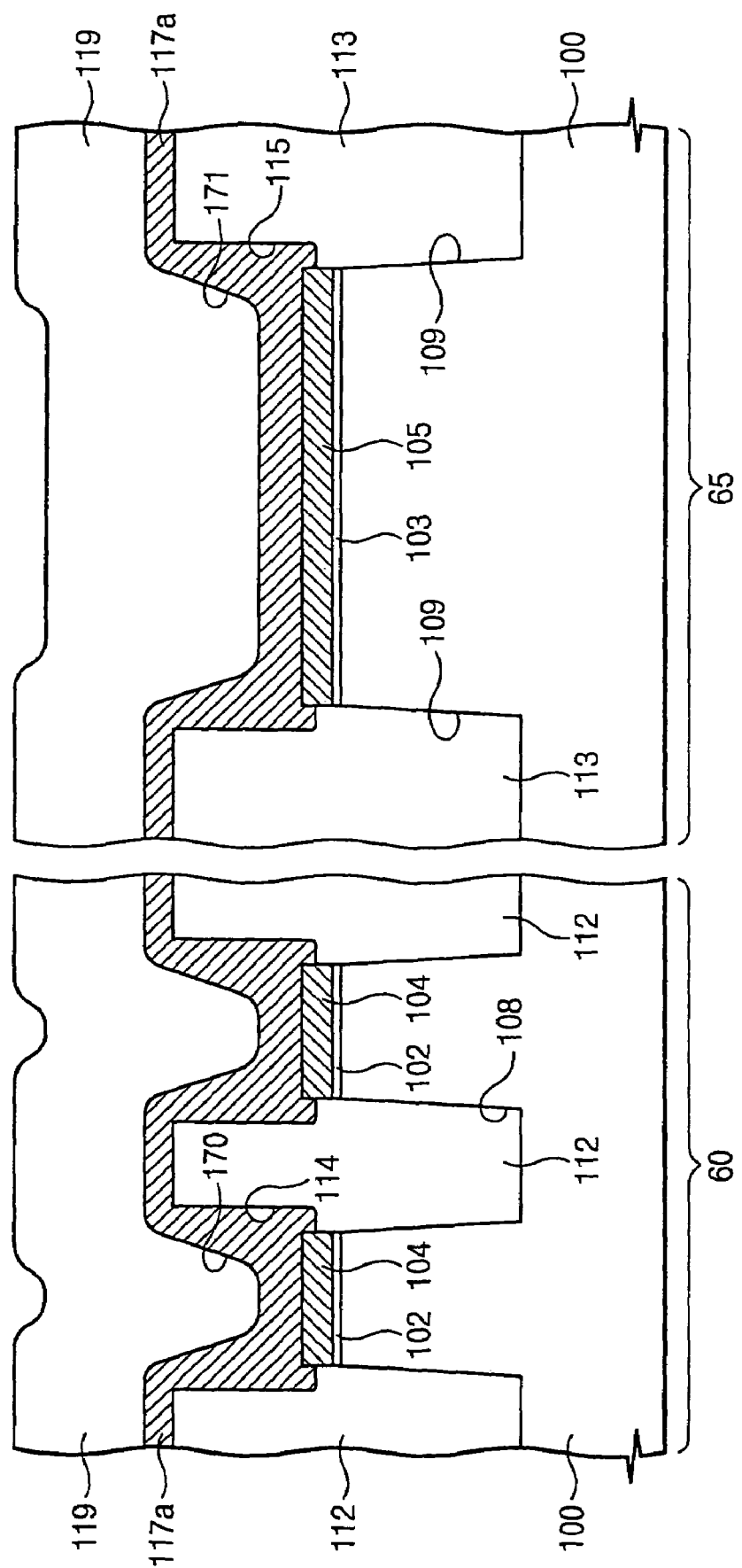

Referring to FIGS. 10A and 10B, a wet etching may be performed on the second gate conductive layer 117 to form a second gate conductive layer pattern 117a having cell grooves 170 and a peripheral groove 171. A cell groove 170 is a region surrounded by portions of the second gate conductive layer pattern 117a formed within the respective cell opening 114, and the peripheral groove 171 is a region surrounded by portions of the second gate conductive layer pattern 117a formed within the peripheral opening 115.

A width between upper sidewalls of the cell groove 170 may be greater than a width between lower sidewalls of the cell groove 170. More particularly, the width between the sidewalls of the cell groove 170 may increase gradually as it goes upward from a bottom of the cell groove 170. Inclinations of sidewalls of a cell groove 170 are symmetric with respect to each other.

In the wet etch discussed above, an etched amount of a first portion 200 of the second gate conductive layer 117 forming an upper corner of the gap region 118 may be different from an etched amount of a second portion 201 of the second gate conductive layer 117 forming the lower sidewalls of the gap region 118. That is, during the wet etching, the first portion 200 may be etched more than the second portion 201, because the first portion 200 may be more exposed to an etchant used in the wet etch than the second portion 201. An etched amount may increase gradually as it goes upward from the lowest sidewall of the gap region 118. By doing so, sidewalls of the cell groove 170 may be inclined, and a width between the sidewalls of a cell groove 170 may increase gradually as it extends upward from the bottom thereof.

Similarly, a width between upper sidewalls of the peripheral groove 171 may be greater than a width between lower sidewalls of the peripheral groove 171. That is, the width between sidewalls of the peripheral groove 171 may increase gradually as the sidewalls extend upward from a bottom of the peripheral groove 171. A distance between portions of the second gate conductive layer 117 respectively formed on both sidewalls of the peripheral opening 115 may be greater than the width of the gap region 118. By doing so, in the wet etch, a difference between an etched amount of the second gate conductive layer 117 formed on the upper sidewalls of the peripheral opening 115 and an etched amount of the second conductive layer 117 formed on the lower sidewalls of the peripheral opening 115 may be smaller than that in the gap region 118. As a result, an inclined angle of the sidewalls of the peripheral groove 171 with respect to an imaginary vertical line perpendicular to the upper surface of the substrate 100 may be less than an inclined angle of the sidewalls of the cell groove 170 with respect to the imaginary vertical line.

More particularly, the second gate conductive layer pattern 117a may be formed so that portions thereof remain on upper surfaces of the cell and peripheral device isolation layers 112 and 113 after the wet etch. At this time, portions of the second gate conductive layer pattern 117a on the device isolation layers 112 and 113 may be thinner than portions remaining on bottoms of the openings 114 and 115 of the second gate conductive layer pattern 117a.

A sacrificial layer 119 filling the cell and peripheral grooves 170 and 171 may be formed on an entire upper surface of the substrate 100. The sacrificial layer 119 may be formed to a sufficient thickness to completely fill the cell and peripheral grooves 170 and 171. The sacrificial pattern 119 may be formed of a material having an etch selectivity with respect to the second gate conductive layer pattern 117a. For example, the sacrificial layer 119 may be formed of a silicon oxide.

Figure 11A:
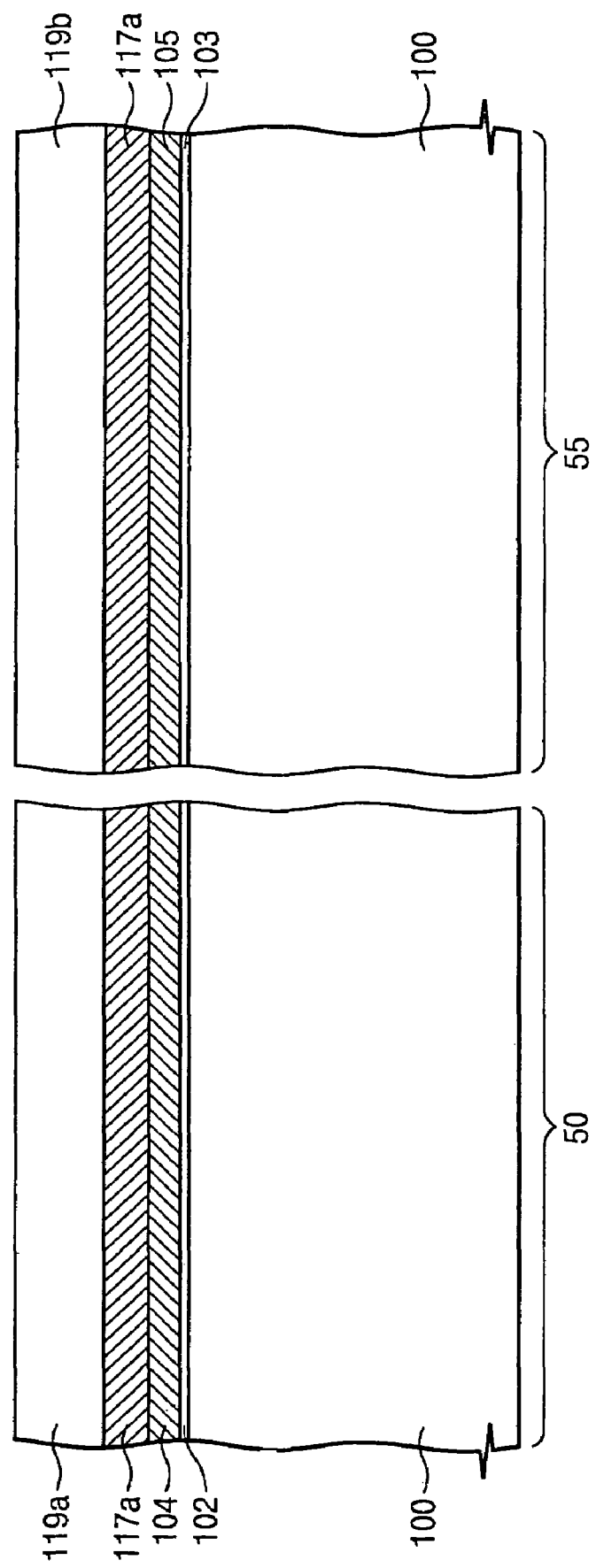
Figure 11B:
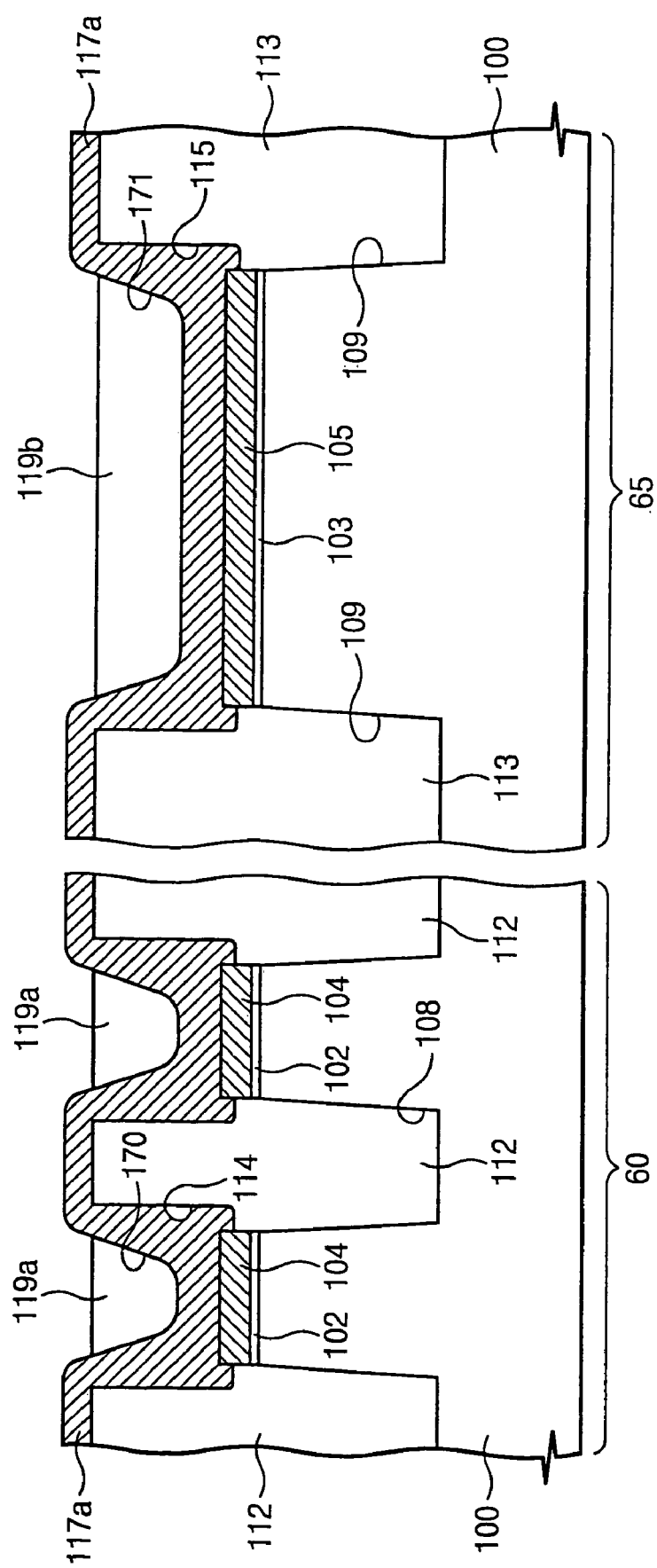

Referring to FIGS. 11A and 11B, the sacrificial layer 119 may be planarized until portions of the second gate conductive layer pattern 117a on the device isolation layers 112 and 113 are exposed, to form a cell sacrificial pattern 119a filling the cell grooves 170 and a peripheral sacrificial pattern 119b filling the peripheral groove 171.

In addition, the sacrificial patterns 119a and 119b may be further recessed. Accordingly, upper surfaces of the sacrificial patterns 119a and 119b can be made approximately even with upper surfaces of the device isolation layers 112 and 113.

Figure 12A:
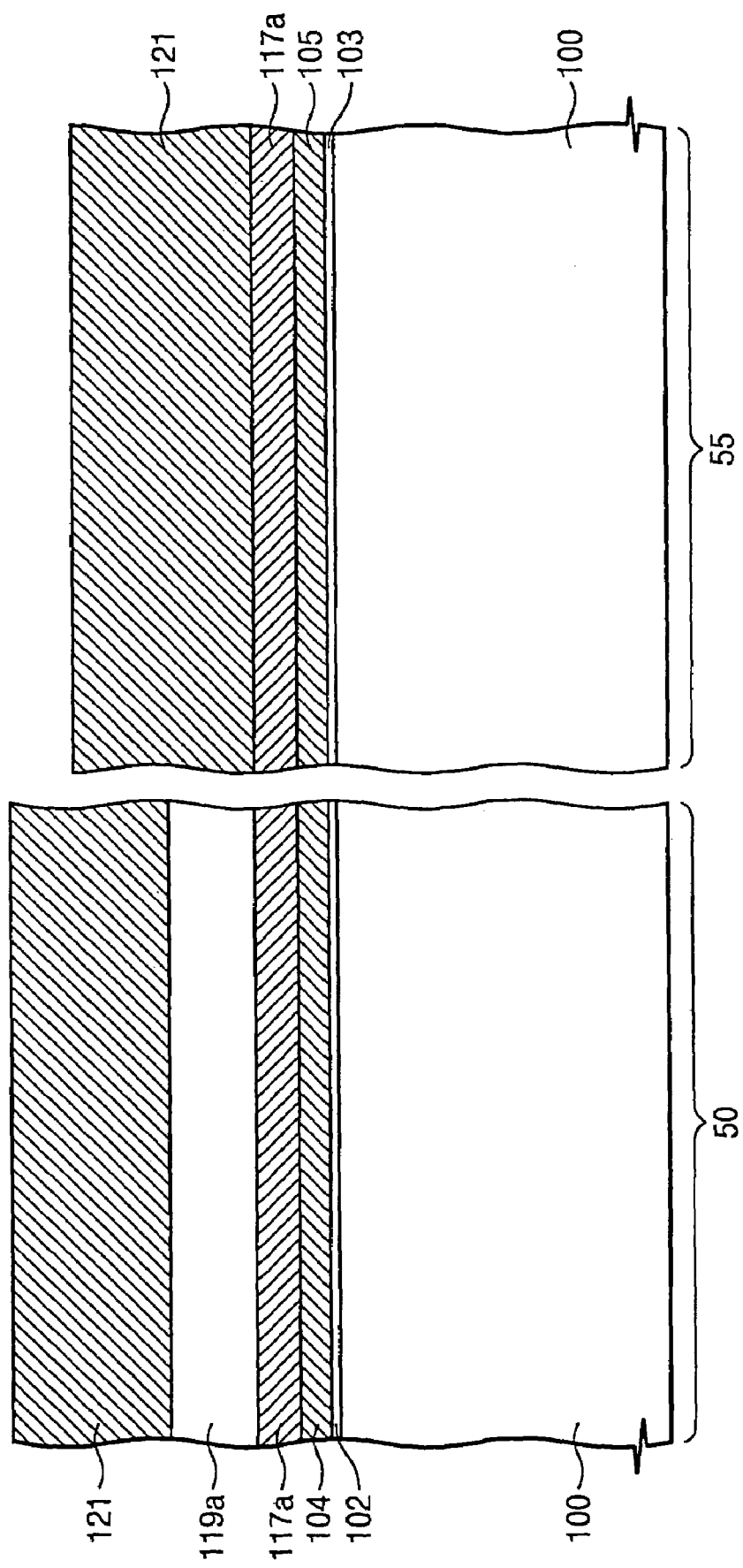
Figure 12B:
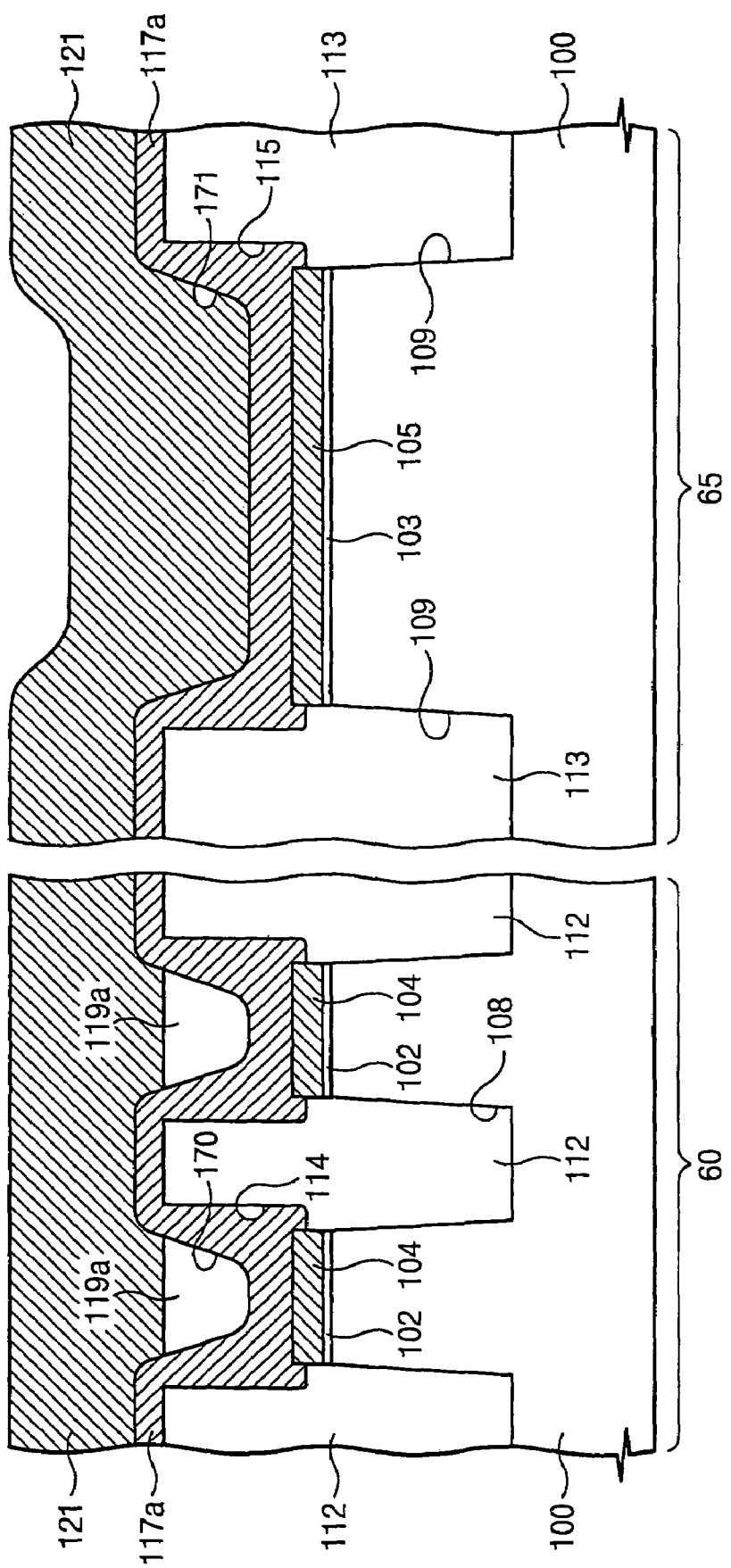

Referring to FIGS. 12A and 12B, the peripheral sacrificial pattern 119b may be selectively removed using a mask pattern (not shown) covering portions of the sacrificial pattern 119a on the cell region 50, 60. By doing so, both sidewalls and bottom portions of the peripheral groove 171 may be exposed.

Next, a third gate conductive layer 121 filling the peripheral groove 171 may be formed on an entire upper surface of the substrate 100. The third gate conductive layer 121 may be formed to a sufficient thickness to fill the peripheral groove 171. The third gate conductive layer 121 contacts the second gate conductive layer pattern 117a within the peripheral opening 115. The third gate conductive layer 121 may be formed of a doped polysilicon, and/or the third gate conductive layer 121 can be formed of or may include other conductive material(s).

Figure 13A:
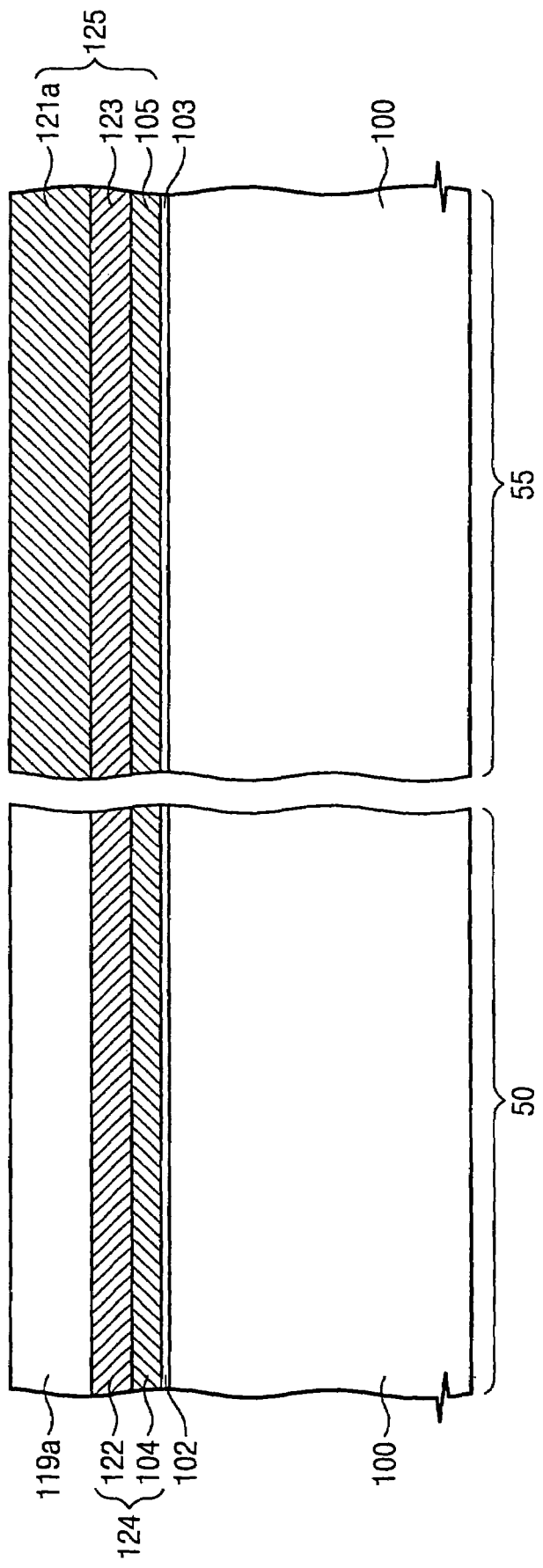
Figure 13B:
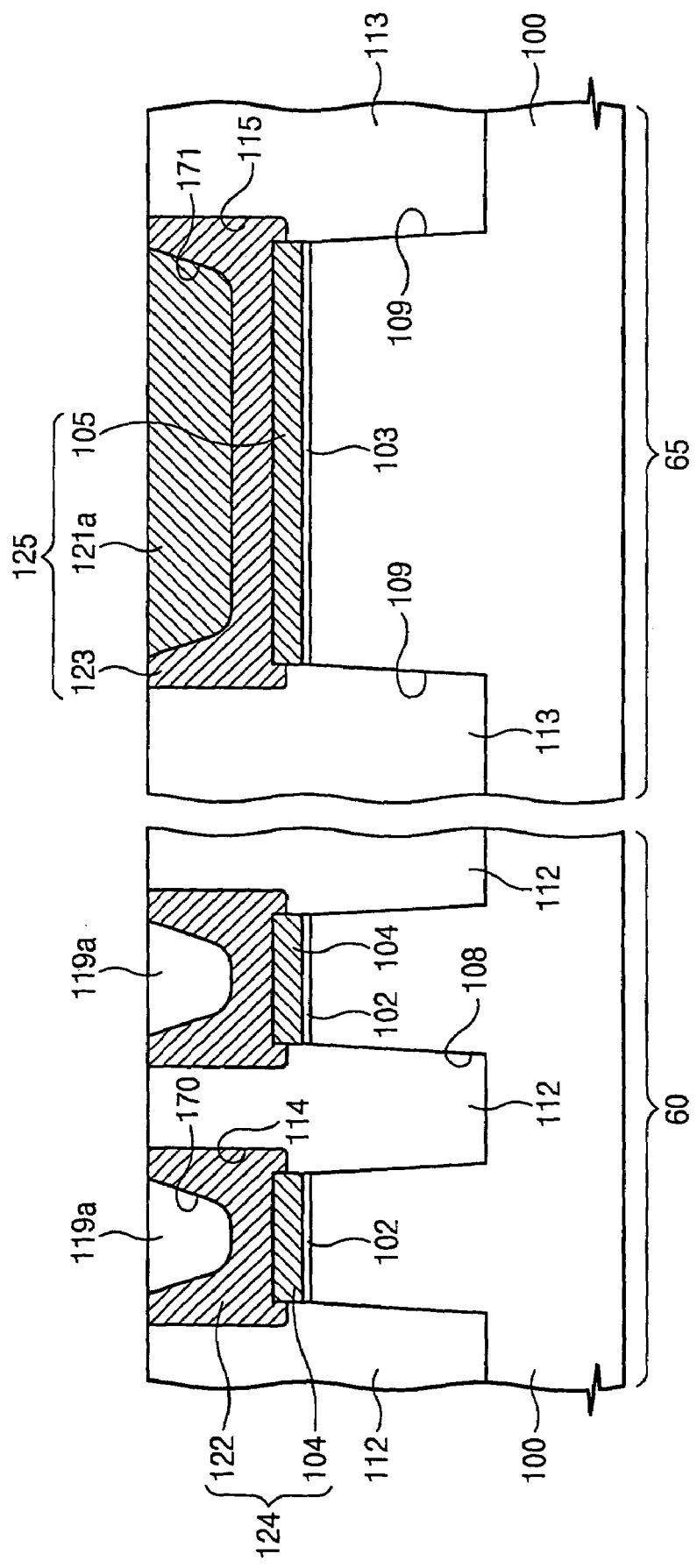

Referring to FIGS. 13A and 13B, the third gate conductive layer 121 and the second gate conductive layer pattern 117a may be planarized until portions of the device isolation layers 112 and 113 and the cell sacrificial pattern 119a are exposed. By doing so, an upper floating gate pattern 122 may be formed within the cell opening 114, and a second lower gate pattern 123 and a third lower gate pattern 121a may be sequentially stacked within the peripheral opening 115. The third lower gate pattern 121a may fill the peripheral groove 171 surrounded by the second lower gate pattern 123. The upper floating gate pattern 122 and the second lower gate pattern 123 may be formed from portions of the second gate conductive layer pattern 117a, and the third lower gate pattern 121a may be formed from portions of the third gate conductive layer 121. Due to the planarizing process, the adjacent upper floating gate patterns 122 may be spaced apart from each other. The process of planarizing the third gate conductive layer 121 and the second gate conductive layer pattern 117a may be performed using a chemical mechanical polishing process.

Each upper floating gate pattern 122 may include a flat portion on the respective lower floating gate pattern 104 and a pair of wall portions extending upward from opposite edges of the flat portion along both sidewalls of the cell opening 114. Each cell groove 170 corresponds to an area surrounded by the flat portion and the pair of wall portions of the respective upper floating gate pattern 122. A lower portion of each wall portion of a upper floating gate pattern 122 may have a greater width than an upper portion of the wall portion of the upper floating gate pattern 122. The wall portions of an upper floating gate pattern 122 may have inner side surfaces forming sidewalls of the cell groove 170 and outer side surfaces contacting the cell device isolation layer 112. The inner side surfaces of the wall portions of the upper floating gate pattern 122 may be inclined. The pair of wall portions of an upper floating gate pattern 122 may be symmetric with respect to each other.

In planarizing the third gate conductive layer 121, the peripheral groove 171 may be filled with the third gate conductive layer 121. By doing so, a dishing phenomenon (that may result from a step height difference of the peripheral groove 171 having a wide width) may be reduced. Also, by the third lower gate pattern 121a filling the peripheral groove 171, a complicated surface step height difference of the peripheral regions 55 and 65 (that may result from a step height difference of the peripheral groove 171) may be reduced.

A lower floating gate pattern 104 and an upper floating gate pattern 122 may provide a preliminary floating gate 124. The first lower gate pattern 105, the second lower gate pattern 123 and the third lower gate pattern 121a may provide a preliminary lower gate electrode 125.

Figure 14B:
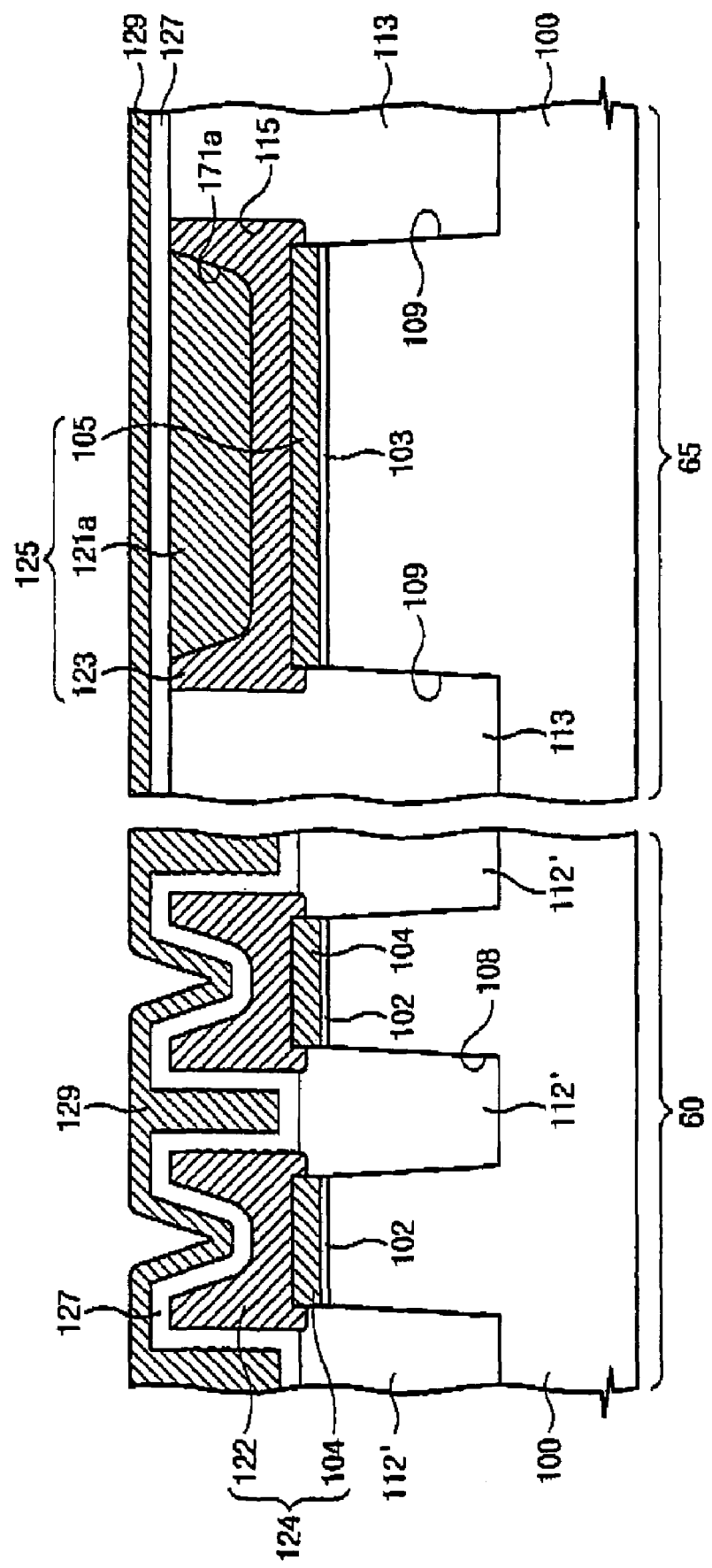
Figure 15A:
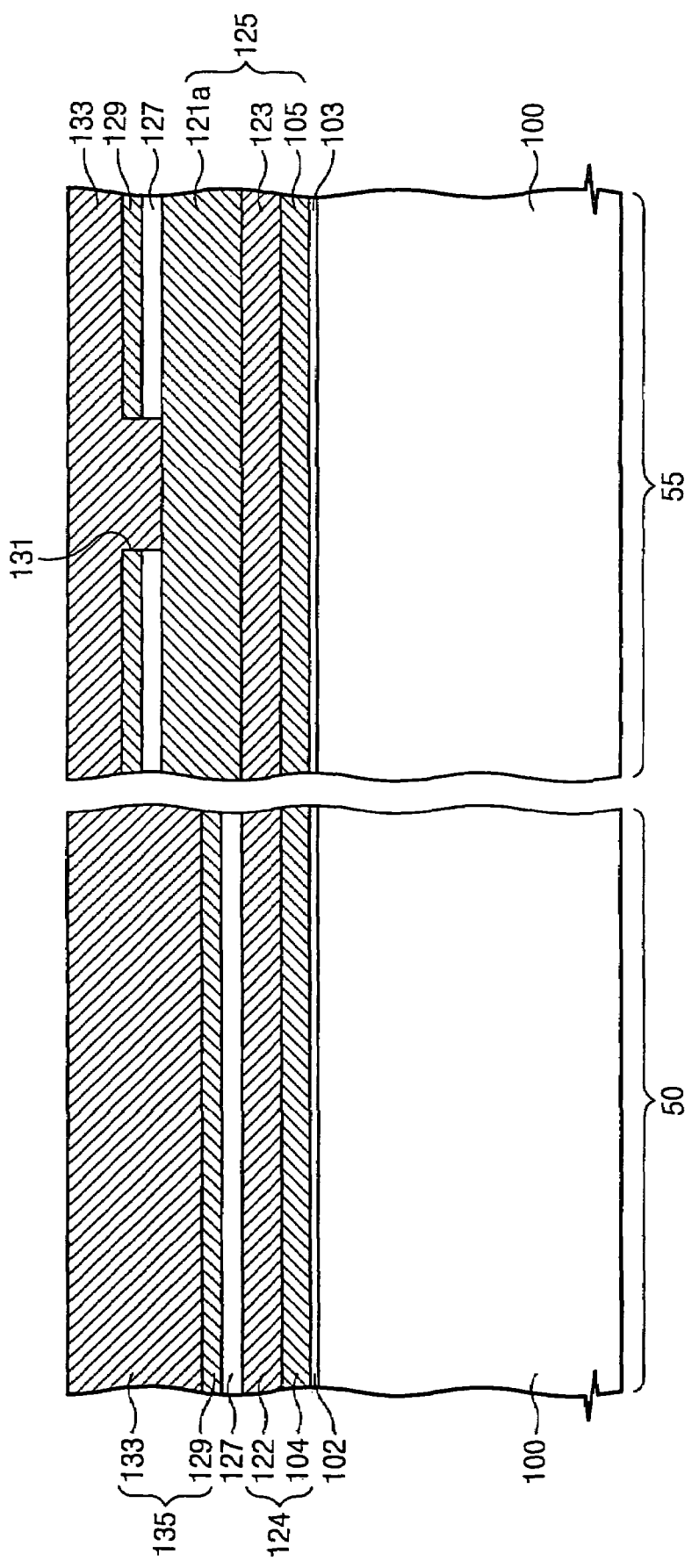
Figure 15B:
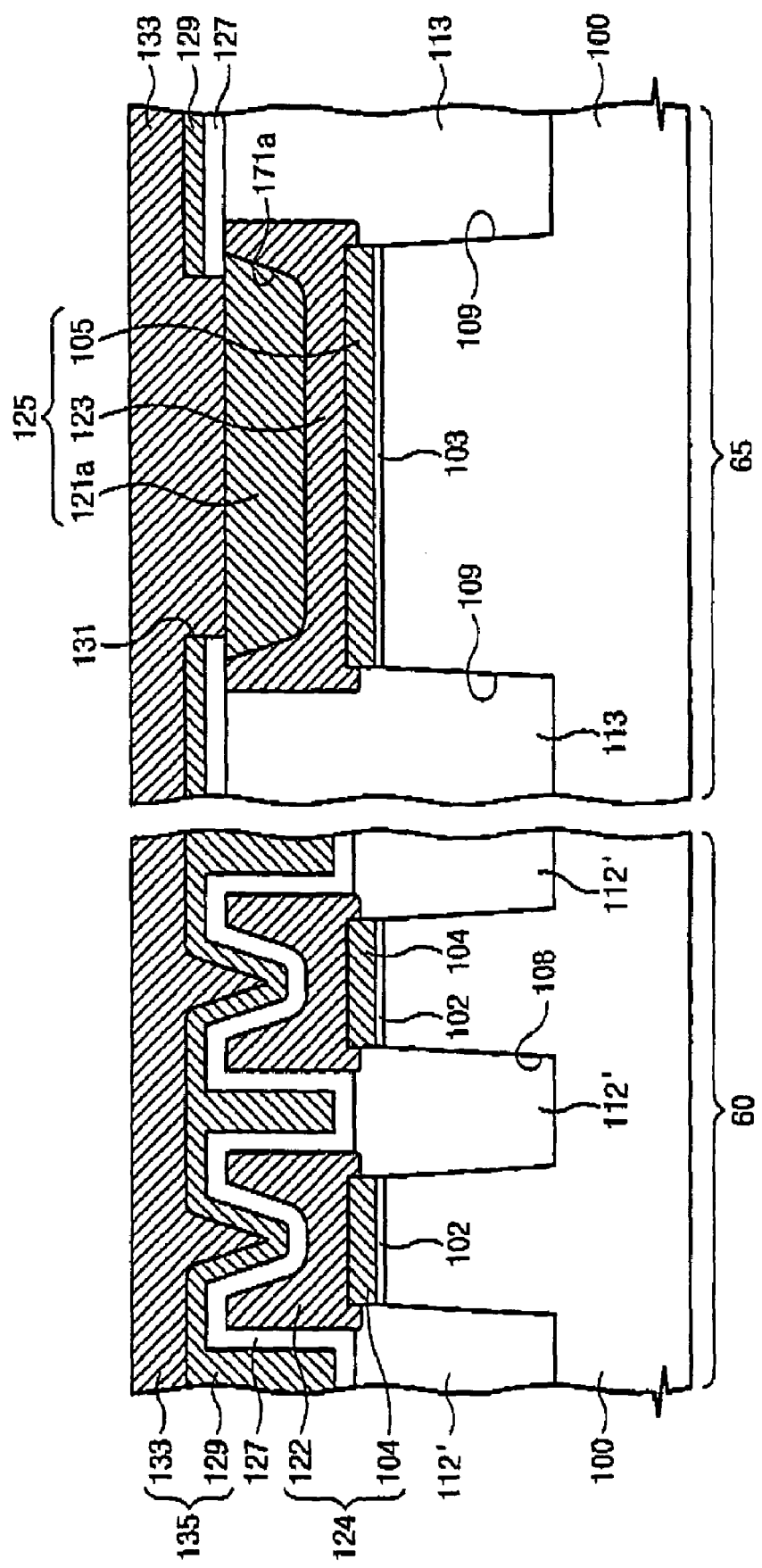

Referring to FIGS. 14A and 14B, the cell sacrificial pattern 119a may be removed to expose both sidewalls and bottoms of the cell grooves 170, and the cell device isolation layer 112 may be recessed. An upper surface of the recessed cell device isolation layer 112' may be approximately even with a lowest surface of the upper floating gate pattern 122. By doing so, outer side surfaces of the upper floating gate pattern 122 adjacent to the recessed device isolation layer 112' may be exposed. Upper surfaces of the recessed device isolation layer 112' may be higher than lower surfaces of lower floating gate patterns 104 and lower than upper surfaces of the lower floating gate patterns 104.

Processes of removing the cell sacrificial pattern 119a and recessing the cell device isolation may be performed simultaneously. While the cell device isolation layer 112' is recessed, a mask pattern may cover the peripheral regions 55 and 65 so that the peripheral device isolation layer is not recessed.

A blocking insulation layer 127 may be conformally formed on an entire upper surface of the substrate 100, and a protective conductive layer 129 may be formed on the blocking insulation layer 127. The protective conductive layer 129 may cover outer sidewalls of the upper floating gate patterns 122 and sidewalls and bottoms of cell grooves 170, with the blocking insulation layer 127 between the protective conductive layer and the upper floating gate patterns 122.

A width of a region between the neighboring upper floating gate patterns 122 can be less than a width of the cell groove 170, because the width of the cell opening 114 may be greater than the width of the cell active region by recessing the device isolation layers 112 and 113 as described with reference to FIGS. 8A and 8B. The blocking insulation layer 127 and the protective conductive layer 129 can fill the region between the neighboring upper floating gate patterns 122.

The blocking insulation layer 127 may be formed of an ONO (oxide/nitride/oxide) layer. In addition or in an alternative, the blocking insulation layer 127 may include a high dielectric layer (e.g., an insulating metal oxide, such as an aluminum oxide layer and/or a hafnium oxide layer) having a dielectric constant higher than that of the tunnel insulation layer 102. The protective conductive layer 127 may be formed of a doped polysilicon. In addition or in an alternative, the protective conductive layer 127 may be formed of and/or may include other conductive material(s).

Referring to FIGS. 15A, 15B, 3, 4 and 5, portions of the protective conductive layer 129 and the blocking insulation layer 127 in the peripheral region 55, 65 may be patterned to form a contact opening 131 exposing portions of the preliminary lower gate electrode 125. The contact opening 131 may expose at least some of the third lower gate pattern 121a. The contact opening 131 may further expose at least portions of the second lower gate pattern 123. The contact opening 131 may be provided in the form of a hole, or the contact opening 131 may be provided in the form of a groove crossing the preliminary lower gate electrode 125.

According to other embodiments of the present invention portions of the protective conductive layer 129 and the blocking insulation layer 127 in the peripheral region 55, 65 may be removed. In this case, the contact opening 131 is not required and all of the upper surface of the preliminary lower gate electrode 125 is exposed.

In forming the contact opening 131 and/or removing all portions of the protective conductive layer 129 and the blocking insulation layer 127 in the peripheral region 55, 65, the protective conductive layer 129 may protect the blocking insulation layer 127 of the cell region 50, 60. That is, the protective conductive layer 129 may reduce contact between portions of the blocking insulation layer 127 and a photoresist film formed on the cell region 50, 60. By doing so, a contamination of the blocking insulation layer 127 due to an organic material that can be caused by a contact between the photoresist film and the blocking insulation layer 127 may be reduced. Also, the protective conductive layer 129 may fill the region between the neighboring upper floating gate patterns 122, thereby reducing a step height difference in the cell region 50, 60 to allow a photolithographic mask pattern to be more easily formed.

A fourth gate conductive layer 133 filling the contact opening 131 may be formed on an entire upper surface of the substrate 100. The fourth gate conductive layer 133 may contact portions of the preliminary lower gate electrode 125 exposed through the contact opening 131. If portions of the protective conductive layer 129 and the blocking insulation layer 127 in the peripheral region 55, 65 are all removed, the fourth gate conductive layer 133 can contact an entire upper surface of the preliminary lower gate electrode 125. Portions of the fourth gate conductive layer 133 in the peripheral region 55, 65 may be defined as an upper gate conductive layer.

Portions of the protective conductive layer and the fourth gate conductive layer 133 in the cell region 50, 60 may provide a control gate conductive layer 135, and the control gate conductive layer 135 may fill remaining portions of the cell grooves 170. In an alternative, the protective conductive layer 129 may be omitted so that the control gate conductive layer 135 includes only the fourth gate conductive layer 133.

The control gate conductive layer 135 may fill remaining portions of the cell groove 170. And the control gate conductive layer 135 may cover outer sidewalls of the upper floating gate patterns 122. If the control gate conductive layer 135 includes the protective conductive layer 129 and the fourth gate conductive layer 133, remaining portions of the cell groove 170 may be filled with some of the protective conductive layer 129, or with some of the protective conductive layer 129 and some of the fourth gate conductive layer 133. If the control gate conductive layer 135 includes only the fourth gate conductive layer 133, remaining portions of the cell groove 170 may be filled with only some of the fourth gate conductive layer 133. If the protective conductive layer 129 is omitted, the fourth gate conductive layer 133 may cover the outer sidewalls of the upper floating gate patterns 122, with the blocking insulation layer 127 between the fourth gate conductive layer 135 and the upper floating gate patterns 122.

If the protective conductive layer 129 is omitted, the contact opening 131 may penetrate portions of the blocking insulation layer 127 in the peripheral region 55, 60.

The fourth gate conductive layer 133 may be formed of a single layer or a composite layer, for example, including one or more of a doped polysilicon layer, a metal layer, (such as a tungsten layer, a molybdenum layer, etc.), a conductive metal nitride, (such as a titanium nitride, a tantalum nitride, etc.) and/or a metal silicide layer, (such as a tungsten silicide layer, a cobalt silicide layer etc.).

Next, the control gate conductive layer 135, the blocking insulation layer 127 and the preliminary floating gate 124 in the cell region 50, 60 may be successively patterned to form a floating gate 124a, a blocking insulation pattern 127a, and a control gate electrode 135a as shown in FIGS. 3, 4 and 5. The fourth gate conductive layer 133, the protective conductive layer 129, the blocking insulation layer 127, and the preliminary lower gate electrode 124 in the peripheral region 55, 65 may be successively patterned to form a peripheral gate electrode 136 and a residual pattern 132. Moreover, the patterning operations used to form the floating gate 124a, the blocking insulation pattern 127a, the control gate electrode 135a, the peripheral gate electrode 136, and the residual pattern 132 may be performed simultaneously.

The lower and upper floating gates 104a and 122a are formed from the lower and upper floating gate patterns 104 and 122, respectively, and the first, second and third lower gates 105a, 123a and 121b may be formed from the first, second and third lower gate patterns 105, 123 and 121a, respectively. A space 170a defined by the upper floating gate 122a may be formed as a part of the cell groove 170, and a hollow region 171a defined by the second lower gate 123a may be formed as a part of the peripheral groove 171. The lower and upper control gates. 129a and 133a of the control gate electrode 135a may be respectively formed from the protective conductive layer 129 and the fourth gate conductive layer 133 of the cell region 50, 60. First and second layers 127b and 129b of the residual pattern 132 may be respectively formed from the blocking insulation layer 127 and the protective conductive pattern 129 of the peripheral region 55, 65. The upper gate electrode 133b may be formed from the fourth gate conductive layer 133 of the peripheral region 55, 65.

The floating gate 124a, the blocking insulation pattern 127a and the control gate electrode 135a and the peripheral gate electrode 136 may be patterned simultaneously.

Impurity ions may be implanted using the control gate electrode 135a as a mask to form cell source/drain regions 137 in the cell active region at both sides of the control gate electrode 135a. Impurity ions may be implanted using the peripheral gate electrode 136 as a mask to form peripheral source/drain regions 139 in the peripheral active region at both sides of the peripheral gate electrode 135a.

The cell and peripheral source/drain regions 137 and 139 may be formed using impurity ions of the same type, and the cell and peripheral source/drain regions 137 and 139 may be formed simultaneously or sequentially. In an alternative, the cell and peripheral source/drain regions 137 and 139 may be formed using impurity ions of different types, in which case the cell and peripheral source/drain regions 137 and 139 are sequentially formed.

The nonvolatile memory device of FIGS. 3, 4 and 5 may thus be formed as discussed above with respect to FIGS. 7A-15A and 7B-15B.

According to methods of forming a nonvolatile memory device as discussed above, the tunnel insulation layer may be formed on a planarized substrate before forming a cell isolation trench. By doing so, the tunnel insulation pattern 102 may be formed with a uniform thickness throughout an entire region below the lower floating gate pattern 104. If the tunnel insulation layer is formed after the trench is formed, portions of the tunnel insulation layer on the upper corner of the trench thinner than other portions of the tunnel insulation layer. A uniformity of thickness of the tunnel insulation layer may thus be improved by forming the cell trench after forming the tunnel insulation layer.

In addition, a the bottom of the preliminary floating gate 124 may include the lower floating gate pattern 104 and a flat portion of the upper floating gate pattern 122, so that the bottom of the preliminary floating gate 124 is sufficiently thick. By patterning the control gate electrode 135a while the layers (i.e., fourth gate conductive layer 133, protective conductive pattern 129 and blocking insulation layer 127) disposed on the bottom of the preliminary floating gate 124 are etched, the bottom of the preliminary floating gate may perform a role as a barrier. As a result, etch damage of the cell active regions at both sides of the control gate electrode 135a can be reduced.

Moreover, methods of forming nonvolatile memory devices shown in FIG. 6 may be very similar to methods discussed above, and will be described with reference to FIGS. 14A, 14B and 6.

Referring to FIGS. 14A, 14B and 6, methods of forming the nonvolatile memory device shown in FIG. 6 may further include recessing the peripheral device isolation layer 113 while recessing the cell device isolation layer 112 as discussed above with reference to FIGS. 14A and 14B. By doing so, outer sidewalls of the preliminary lower gate electrode 125 may be exposed. An upper surface of the recessed device isolation layer 113' (shown in FIG. 6) can be formed at a height approximately even with a lowest surface of the second lower gate pattern 123. More particularly, an upper surface of the recessed device isolation layer 113' may be formed higher than a lower surface of the first lower gate pattern 105 and lower than an upper surface of the first lower gate pattern 105.

Forming the blocking insulation layer 127 and subsequent operations may be the same as those discussed above. By doing so, the nonvolatile memory device shown in FIG. 6 may be provided.

As described above according to embodiments of the present invention, a floating gate of a nonvolatile memory device may include a relatively flat portion and a pair of wall portions extending upwardly from opposing edges of the flat portion. A side surface area of the floating gate adjacent to the cell source/drain region may be reduced by providing a space/gap 170a. As a result, adjacent areas between neighboring floating gates may be reduced thereby reducing a parasitic static capacitance therebetween.

Also, a control gate electrode may fill portions of the space in the floating gate so that an overlapping area between the control gate electrode and the floating gate in a limited area may be increased thereby increasing a coupling ratio.

Additionally, a width of an upper portion of the space in the floating gate may be greater than a width of a lower portion of the space. Accordingly, an aspect ratio of the space may be reduced so that the control gate electrode may more easily fill the space.

Further, a width of a lower portion of the wall portion of the floating gate may be greater than a width of an upper portion of the wall portion. Accordingly, in a programming and/or erasing operation, a depletion region formed in the lower portion of the wall portion may be reduced to thereby enhance operation speeds of the nonvolatile memory device. Furthermore, a width of an upper portion of a portion of the control gate electrode filling the space may be greater than a width of a lower portion thereof. Accordingly, in a programming and/or erasing operation, a depletion region formed in the upper portion of the control gate electrode filling the space may be reduced to thereby enhance operation speeds of the nonvolatile memory device.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A nonvolatile memory device comprising:
a substrate including a cell region and a peripheral circuit region;
a cell device isolation layer disposed on the cell region of the substrate to define a cell active region;
a floating gate including a lower floating gate and an upper floating gate sequentially stacked on the cell active region wherein the upper floating gate includes a flat portion disposed on the lower floating gate and a pair of wall portions extending upward from both edges of the flat portion adjacent to the cell device isolation layer, and a width of an upper portion of a space surrounded by the flat portion and the pair of wall portions is larger than a width of a lower portion of the space;

a tunnel insulation pattern interposed between the floating gate and the cell active region;

a control gate electrode disposed on the floating gate; and a blocking insulation pattern interposed between the control gate electrode and the floating gate;

a peripheral device isolation layer formed on the peripheral region to define a peripheral active region;

a peripheral gate electrode including a lower gate electrode and an upper gate electrode sequentially stacked on the peripheral active region, the upper gate electrode being connected with the lower gate electrode; and a peripheral gate insulation pattern interposed between the peripheral gate electrode and the peripheral active region, wherein the lower gate electrode comprises, a first lower gate disposed on the peripheral gate insulation pattern, a second lower gate including a peripheral flat portion disposed on the first lower gate and a pair of peripheral wall portions extending upward from both edges of the peripheral flat portion adjacent to the peripheral device isolation layer, and a third lower gate filling a hollow region surrounded by the peripheral flat portion and the pair of peripheral wall portions.

2. The nonvolatile memory device of claim 1, wherein a width of an upper portion of the hollow region is larger than a width of a lower portion of the hollow region.

3. The nonvolatile memory device of claim 1, wherein a spacing distance between the pair of peripheral wall portions is larger than a spacing distance between the pair of wall portions of the floating gate.

4. The nonvolatile memory device of claim 1, wherein the first lower gate and the lower floating gate are formed of the same material, the second lower gate and the upper floating gate are formed of the same material, and the control gate electrode and the upper gate electrode are formed of the same material.

5. The nonvolatile memory device of claim 1, wherein the upper gate electrode covers outer side surfaces of the second lower gate adjacent to the peripheral device isolation layer.

6. The nonvolatile memory device of claim 1, wherein the peripheral device isolation layer protrudes higher than the upper surface of the substrate and covers outer side surfaces of the second lower gate adjacent to the peripheral device isolation layer, and the upper gate electrode passes over the peripheral device isolation layer.

7. The nonvolatile memory device of claim 1, further comprising a residual pattern interposed between the upper gate electrode and the lower gate electrode, wherein the upper gate electrode fills a contact opening penetrating the residual pattern to contact the lower gate electrode.

8. The nonvolatile memory device of claim 1, wherein the upper gate electrode contacts an entire upper surface of the lower gate electrode.

9. The nonvolatile memory device of claim 1, further comprising:

a cell source/drain region formed in the cell active region at both sides of the control gate electrode; and a peripheral source/drain region formed in the peripheral active region at both sides of the peripheral gate electrode.

* * * * *